(12) United States Patent
Ortlieb et al.

(10) Patent No.: US 7,488,518 B2
(45) Date of Patent: Feb. 10, 2009

(54) METHOD AND DEVICE FOR CURING A COATING

(75) Inventors: Konrad Ortlieb, Stuttgart (DE);
Dietmar Wieland, Stuttgart (DE);
Wolfgang Tobisch, Stuttgart (DE);
Dietmar Roth, Oberlungwitz (DE);
Karl-Heinz Dittrich, Chemnitz (DE)

(73) Assignee: Duerr Systems GmbH, Stuttgart (DE)

( * ) Notice: Subject to any disclaimer, the term of this patent is extended or adjusted under 35 U.S.C. 154(b) by 412 days.

(21) Appl. No.: 10/417,888

(22) Filed: Apr. 17, 2003

(65) Prior Publication Data

US 2004/0101635 A1 May 27, 2004

(30) Foreign Application Priority Data

Apr. 19, 2002 (EP) .................. 02008255

(51) Int. Cl.
*C08J 7/18* (2006.01)
*C08F 2/50* (2006.01)
*C08F 2/52* (2006.01)

(52) U.S. Cl. .................. 427/491; 427/512; 427/517; 427/519; 427/536; 427/553

(58) Field of Classification Search .................. None
See application file for complete search history.

(56) References Cited

U.S. PATENT DOCUMENTS

| | | | | | |
|---|---|---|---|---|---|
| 3,364,387 | A | * | 1/1968 | Anderson | 315/111.11 |
| 3,899,611 | A | * | 8/1975 | Hall | 427/488 |
| 3,915,824 | A | * | 10/1975 | McGinniss | 522/2 |
| 3,935,330 | A | * | 1/1976 | Smith et al. | 427/487 |
| 3,939,126 | A | | 2/1976 | Carder et al. | |
| 3,943,103 | A | | 3/1976 | Borden et al. | |
| 3,962,486 | A | * | 6/1976 | Gerek et al. | 427/447 |
| 4,049,842 | A | * | 9/1977 | Gerek et al. | 427/447 |
| 4,288,479 | A | | 9/1981 | Brack | |
| 4,289,798 | A | * | 9/1981 | Bagley et al. | 427/493 |
| 4,639,379 | A | * | 1/1987 | Asai et al. | 427/489 |
| 5,069,926 | A | | 12/1991 | Iwata et al. | |
| 5,211,995 | A | | 5/1993 | Kuehnle et al. | |
| 5,270,267 | A | | 12/1993 | Ouellet | |
| 5,520,741 | A | | 5/1996 | Schneider et al. | |

(Continued)

FOREIGN PATENT DOCUMENTS

DE 199 53 433 5/2001

(Continued)

OTHER PUBLICATIONS

E.J. Hellund, The Plasma State, 1961 (no month) Reinhold publishing Corp., New York, excerpt pp. 3, 83-84.*

(Continued)

*Primary Examiner*—Marianne L Padgett
(74) *Attorney, Agent, or Firm*—Lipsitz & McAllister, LLC

(57) ABSTRACT

In order to provide a process for curing a coating, in particular a radiation-curable coating, on a work piece, which allows coatings even on difficult to access regions of a three-dimensional work piece to be cured in a simple manner, it is proposed that the work piece is disposed in a plasma generation area, and that in the plasma generation area a plasma is generated, by means of which the coating is at least partially cured.

61 Claims, 9 Drawing Sheets

U.S. PATENT DOCUMENTS

| | | | |
|---|---|---|---|
| 5,580,606 A | 12/1996 | Kai | |
| 5,974,687 A * | 11/1999 | Gante et al. | 34/265 |
| 6,020,458 A * | 2/2000 | Lee et al. | 528/401 |
| 6,057,004 A * | 5/2000 | Oppawsky et al. | 427/535 |
| 6,123,991 A | 9/2000 | Spallek et al. | |
| 6,156,394 A * | 12/2000 | Schultz Yamasaki et al. | 427/536 |
| 6,165,561 A * | 12/2000 | Blum et al. | 427/409 |
| 6,207,239 B1 * | 3/2001 | Affinito | 427/488 |
| 6,214,422 B1 | 4/2001 | Yializis | |
| 6,335,381 B1 | 1/2002 | Hovestadt et al. | |
| 6,531,188 B1 | 3/2003 | Maag et al. | |
| 7,001,643 B1 * | 2/2006 | Blum et al. | 427/412.1 |

FOREIGN PATENT DOCUMENTS

| | | |
|---|---|---|
| EP | 0 095 974 | 12/1983 |
| EP | 0 361 206 | 4/1990 |
| EP | 0 424 873 | 5/1991 |
| EP | 1 155 818 | 11/2001 |
| FR | 2 230 831 | 12/1974 |
| GB | 1 412 211 | 10/1975 |
| GB | 1 564 541 | 4/1980 |
| JP | 50-113541 | 9/1975 |
| JP | 60-250038 | 12/1985 |
| JP | 03-139534 | 6/1991 |
| JP | 07-507601 | 8/1995 |
| JP | 10-507705 | 7/1998 |
| JP | 11-263859 | 9/1999 |
| JP | 2000-26800 | 1/2000 |
| JP | 2001-523573 | 11/2001 |
| WO | 93/25300 | 12/1993 |
| WO | 97/37844 | 10/1997 |
| WO | 99/53524 | 10/1999 |
| WO | 01/66824 | 9/2001 |

OTHER PUBLICATIONS

Souheng Wu: "Polymer interface and adhesion", Polymer Interface and Adhesion, New York, Marcel Dekker, US, 1982, pp. 298-302 (XP-002330656), no month.

F. Hochart, J. Levalois-Mitjaville, R. De Jaeger: "Application of a cold plasma process for polymerization and copolymerization of fluorinated and hydrogenated (meth)acrylates", Polymer 41 (2000), pp. 3159-3165.

* cited by examiner

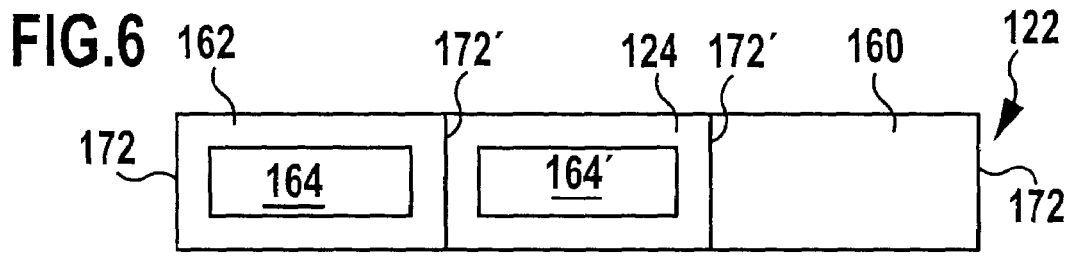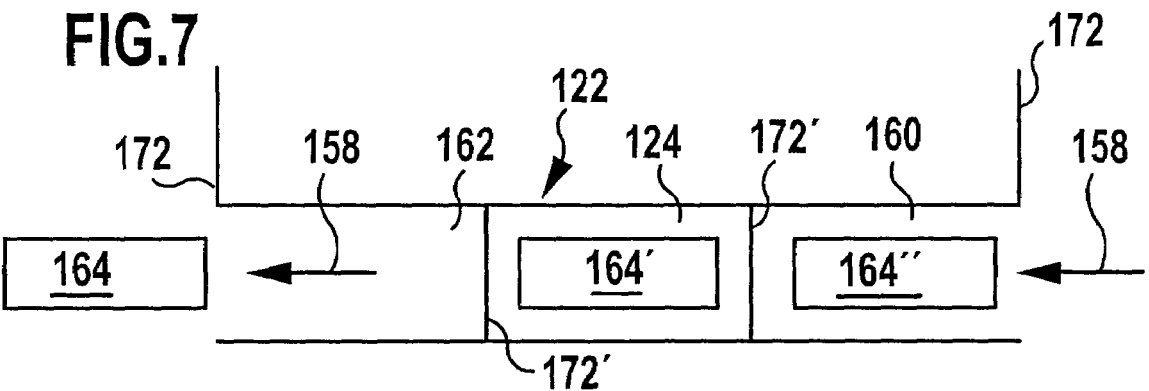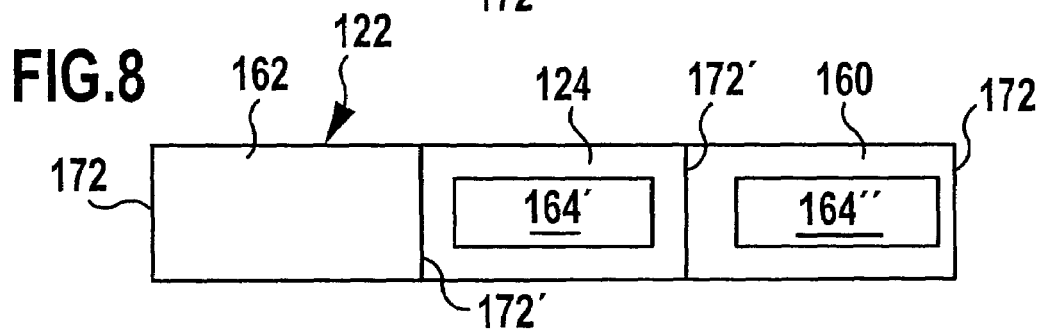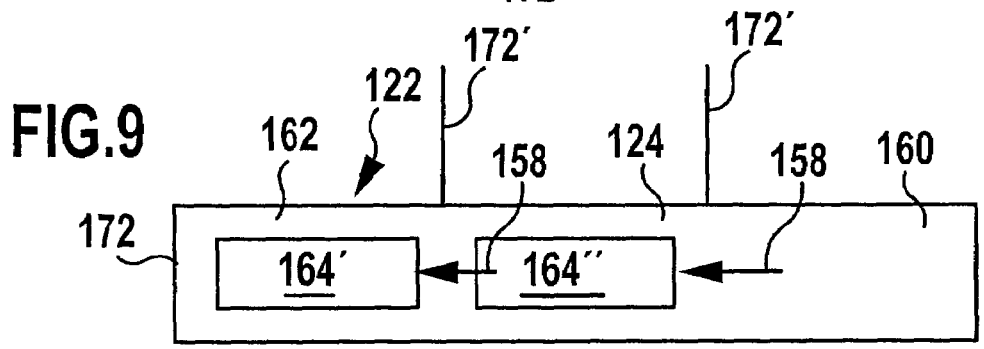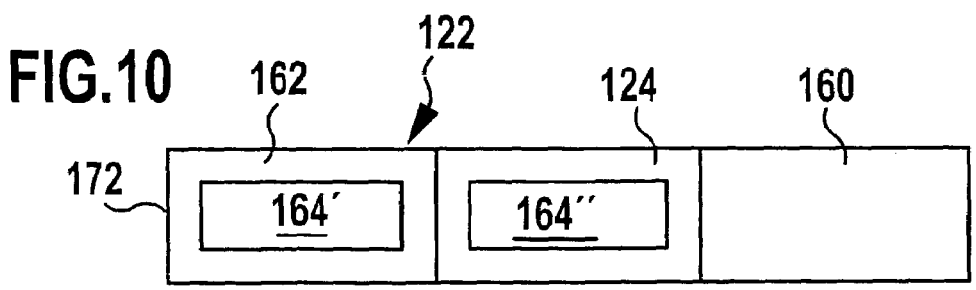

METHOD AND DEVICE FOR CURING A COATING

The present invention relates to a process and a device for curing a coating, in particular a radiation-curable coating, on a work piece.

It is known from the prior art to provide work pieces with a coating of a material, which cures when irradiated with uv light, and to subsequently subject the thus coated work piece to uv radiation.

In particular, it is known to coat work pieces, e.g. vehicle bodies, with a uv-curable clear varnish and to cure this coating by irradiating the work piece with uv light.

Such uv-curable clear varnishes are distinguished by a particularly high scratch resistance.

In the known processes and devices for curing uv-curable coatings, the coated work pieces are irradiated by uv light from uv lamps.

If the coated work pieces have a complex three-dimensional geometry with undercuts and shaded regions, then it is necessary to install the uv lamps on handling devices, which are movable relative to the work piece, so that all the coated surfaces of the work piece can be covered by the uv lamps. Since the uv lamps are bulky, not every undercut region or otherwise shaded region can be reached by the uv light, even when such handling devices are used. The regions of the coating not reached by the uv light cannot cure, and this causes constituents of the coating that has not cured to evaporate during the period of operation of the work piece and therefore a long-lasting odour contamination that is harmful to health results.

To avoid this problem, it is already known to use hybrid paint systems which can be cured both by uv radiation and by the supply of heat. Such a hybrid paint system allows the regions of the work piece readily accessible for uv lamps to be cured by uv radiation and the poorly accessible regions of the work piece to be cured by heat convection. A disadvantage is that to completely cure such a hybrid paint system two completely different process steps have to be conducted one after the other, namely the uv irradiation and curing by heat convection, which results in a high expense in terms of time and equipment, since both the uv lamps and suitable heating devices must be available in the curing process.

Therefore, the object forming the basis of the invention is to provide a process for curing coatings, in particular radiation-curable coatings, which also allows coatings on difficult to access regions of a three-dimensional work piece to be cured in a simple manner.

This object is achieved according to the invention with a process in which the work piece is disposed in a plasma generation area, and that in the plasma generation area a plasma is generated, by means of which the coating is at least partially cured.

The solution according to the invention is based upon the knowledge that a plasma can be used for curing the coating. Because the work piece itself is disposed inside the plasma generation area and the work piece is located inside the generated plasma, the coating on all surfaces of the work piece, even on difficult to access inside surfaces, can be cured.

The plasma can in particular cause the curing of the coating because the coating is radiation-curable and a radiation suitable for curing the coating is generated in the plasma.

Because the work piece itself is disposed inside the plasma generation area and the work piece is located inside the generated plasma, the radiation emitted by the plasma can reach the work piece from different sides. In particular, the plasma can also be generated inside cavities of the work piece, so that the boundary surfaces of these cavities can be subjected to suitable radiation for curing the coating from the cavity itself. In this manner, the radiation suitable for curing the coating can reach any desired coated surface of the work piece, in particular also undercut regions or shaded regions of the work piece, so that the radiation-curable coating present on the work piece can be cured completely without complicated and expensive handling devices being necessary for this.

The coating is preferably essentially completely cured by means of the plasma. In this case, the process according to the invention only requires a single process step, namely the plasma curing, so that the curing process according to the invention can be conducted in a time-saving manner at low equipment expense.

Moreover, it is sufficient if the coating is radiation-curable; in particular, the coating must not at the same time be curable by heat, so that there is no need for complex hybrid paint systems.

Without the thermal curability, a radiation-curable material, which has a higher quality, in particular a higher scratch resistance, can be used for the coating.

Since in the process according to the invention the plasma constantly occupies the space in the plasma generation area not occupied by the work piece, a change in the work piece geometry only has a slight effect on the course of the process, or no effect at all.

Since the curing of the coating is achieved by irradiation and not, at least not exclusively, by heat convection, it is not necessary to heat the entire work piece to cure the coating. As a result, the energy cost required for curing is clearly reduced.

A separate thermal curing process, e.g. by heat convection and/or by irradiation with infrared light, can be provided before, during or after the plasma curing process.

In a preferred configuration of the invention it is provided that an electromagnetic radiation comprising at least a uv radiation component is generated in the plasma.

The term "uv radiation" in this description and the attached claims refers to electromagnetic radiation with a wavelength in the range of 1 nm to 400 nm.

The wavelength range and the dose of electromagnetic radiation generated in the plasma can be influenced by the appropriate selection of the composition of the process gas, from which the plasma is generated, and the type of energy input into the plasma as well as the operating pressure of the plasma.

The component of extremely short-wave radiation with a wavelength below 100 nm should be kept as small as possible to avoid damage of the coating to be cured.

Moreover, it has proved advantageous for the quality of the cured coating to limit the period of time, during which the coating is exposed to the irradiation from the plasma, to approximately 120 seconds at maximum, preferably approximately 90 seconds at maximum.

Preferably, the plasma is generated such that the plasma emits an electromagnetic radiation with a wavelength in the range of approximately 50 nm to approximately 850 nm, in particular in the range of approximately 50 nm to approximately 700 nm, preferably in the range of approximately 150 nm to approximately 700 nm, particularly preferred in the range of approximately 200 nm to approximately 600 nm.

It is particularly favourable if the radiation emitted by the plasma emits at least a uv radiation component preferably in the range of approximately 200 nm to approximately 400 nm.

The work piece is advantageously provided with a radiation-curable coating that may be cured with the radiation emitted by the plasma.

It is particularly favourable if the work piece is provided with a coating, which may be cured by an electromagnetic radiation comprising at least a uv radiation component, preferably in the range of approximately 200 nm to approximately 400 nm.

It has proved particularly favourable for the generation of a plasma emitting high doses of radiation suitable for curing the coating if the pressure in the plasma generation area is set to a value of approximately 100 Pa at maximum, preferably approximately 1 Pa at maximum, in particular approximately 0.1 Pa at maximum.

In addition, working with such low pressures has the advantage that curing of the coating essentially occurs with the exclusion of oxygen. Since oxygen acts as an inhibitor for the cross-linking reaction of the coating, curing of the coating can proceed more quickly in a vacuum and/or the power to be fed into the plasma can be reduced in comparison to a cross-linking reaction proceeding in an oxygen atmosphere.

The gas used as process gas, from which the plasma is generated, should be one which is chemically inert and easily ionised.

It has proved particularly favourable if the plasma generation area contains nitrogen and/or an inert gas, preferably argon, as process gas.

In addition, to increase the yield of usable radiation, it may be of advantage if a metal, e.g. mercury, or a metal halide, e.g. $OsF_7$ or $IrF_6$, is added to the process gas.

In principle, the plasma can be generated either by application of a static electric field to the plasma generation area and/or by input of an electromagnetic alternating field into the plasma generation area.

It is preferably provided that the plasma is generated by the input of electromagnetic radiation into the plasma generation area by means of at least one input device.

The frequency of this electromagnetic radiation input into the plasma generation area can lie in the microwave range or high-frequency range.

In this description and the attached claims, microwave radiation is understood to mean an electromagnetic radiation with a frequency in the range of 300 MHz to 300 GHz and high-frequency radiation is understood to mean an electromagnetic radiation with a frequency of 3 kHz to 300 MHz.

The use of microwave radiation has proved particularly suitable for the generation of high doses of uv radiation.

Therefore, in a preferred configuration of the invention it is provided that the plasma is generated by the input of microwave radiation, preferably with a frequency in the range of approximately 1 GHz to approximately 10 GHz, in particular in the range of approximately 2 GHz to approximately 3 GHz.

The electromagnetic radiation to be input can be generated in particular by means of a magnetron.

In order to increase the ionising effect of the input electromagnetic radiation, it can be provided that a magnetic field is generated for the generation of an ECR ("electron cyclotron resonance") effect. In this case, a static magnetic field oriented inside the plasma generation area essentially parallel to the axis of the electromagnetic alternating field input into the plasma generation area is generated, for example, by means of a magnetising coil array. The intensity of the magnetic field is set so that the cyclotron frequency of the electrons in the magnetic field corresponds to the frequency of the input electromagnetic radiation. In this resonance case, the free electrons in the plasma generation area absorb a particularly large amount of energy from the electromagnetic alternating field, which results in a particularly efficient ionisation of the process gas.

To be able to respectively generate the highest possible ion densities at different locations of the plasma, it can be provided that the electromagnetic radiation is input into the plasma generation area by means of several input devices, the input devices preferably being disposed on different sides relative to the work piece.

If the work piece to be treated has a cavity with an access opening, then the electromagnetic radiation is advantageously input into the plasma generation area by means of at least one input device such that the electromagnetic radiation passes through the access opening into the cavity of the work piece. This ensures that a plasma with a high ion concentration and a correspondingly high uv emission is also generated in the cavity of the work piece, so that the coating on the boundary surfaces of the cavity can be cured quickly.

If the work piece is a vehicle body, then it is particularly important to cure the paint overspray reaching into the interior of the vehicle body during painting. This is facilitated in the process according to the invention in particular by arranging input devices for electromagnetic radiation opposite the window openings of the vehicle body, i.e. in such a manner that the axis of the radiation field generated by the input devices points through the window opening into the interior of the vehicle body.

In a preferred configuration of the invention, it is provided that a gas to be ionised is fed to the plasma generation area during the curing process.

The gas to be ionised can in particular be nitrogen or an inert gas, e.g. argon.

As a result of the continuous feed of gas to be ionised to the plasma generation area during the curing process, a flow can be generated in the plasma generation area, through which ionised gas particles and/or gas particles stimulated by collisions with ionised particles can also reach into shaded regions of the work piece, into which the input electromagnetic radiation does not reach and where therefore no plasma can be ignited.

Moreover, generation of a gas flow in the plasma generation area results in a plasma that is as homogeneous and isotropic as possible and thus in a dose of the radiation suitable for curing the coating that is as independent of location and direction as possible.

It is particularly favourable if the gas to be ionised is fed to the plasma generation area by means of a feeder device, which is adjacent to an input device, by means of which an electromagnetic radiation is input into the plasma generation area. If before distribution in the plasma generation area the gas is directed as closely as possible past the point at which the electromagnetic radiation is fed in, a particularly high ion concentration is generated in the introduced gas which is subsequently distributed in the entire plasma generation area through the gas flow.

To enable the process according to the invention to be conducted in a particularly time saving manner, it can be provided that before the curing process the work piece is placed into an antechamber, is subjected to a pre-treatment there, and is transferred from the antechamber into the plasma generation area for the curing process.

In particular, it can be provided that the antechamber is evacuated after the work piece has been placed therein, so that in this case the antechamber serves as a feed chamber, in which the ambient pressure of the work piece is reduced from the atmospheric pressure to the operating pressure of the plasma generation area.

The evacuation of the antechamber causes the solvents contained in the coating to evaporate in advance, so that pre-drying of the coating to be cured already occurs in the antechamber.

Alternatively or in addition to this, it can be provided that the work piece is subjected to electromagnetic radiation, in particular microwave radiation, in the antechamber. In this case, the coating to be cured can be pre-dried in particular by direct absorption of the energy from the electromagnetic radiation. Alternatively or in addition to this, it is also possible to ignite a plasma in the antechamber, which emits radiation suitable for curing the coating to thus already effect a first curing process of the coating.

In addition, it can be provided that the work piece is transferred from the plasma generation area into a discharge chamber after the curing process.

In particular, it can be provided that before the work piece is transferred into the discharge chamber, the discharge chamber is evacuated to the operating pressure of the plasma generation area.

After transfer of the work piece into the discharge chamber, the discharge chamber can be aerated, i.e. the pressure in the discharge chamber increased to atmospheric pressure, and the work piece subsequently removed from the discharge chamber.

The present invention also encompasses a work piece with a coating, which has been cured using the process according to the invention.

The work piece can comprise any desired material, in particular metallic and/or non-metallic material.

In particular, the work piece can be made of steel, plastic or wood, for example.

The process according to the invention is most particularly suitable for curing a coating on a work piece, which is non-planar and/or three-dimensional in construction.

A non-planar work piece is a work piece, whose coated surfaces do not all lie in the same plane, but in different planes, in particular planes that are not oriented parallel to one another, and/or are not plane.

In particular, the non-planar work piece can have coated surfaces, the surface normals of which are oriented opposed to one another.

In particular, the process according to the invention is suitable for curing a coating on a work piece, which has at least one coated undercut and/or at least one coated shaded region.

In this case, the shaded region of the work piece is a region which would not be reached directly by the light emitted from the light source when the work piece is illuminated by means of a point or plane light source.

The process according to the invention is suitable for curing a coating on a work piece, which comprises an electrically conductive material and is preferably formed completely from one or more electrically conductive materials.

In particular, it can be provided that the work piece comprises a metallic material and is preferably formed completely from one or more metallic materials.

Alternatively or in addition to this, however, it may also be provided that the work piece comprises a plastic material and/or wood and is preferably formed completely from one or more plastic materials or completely from wood.

The plasma generation area can contain a single gas or a mixture of several gases as process gas, in which a plasma is generated by ionisation.

It has proved particularly favourable if the plasma generation area contains nitrogen, helium and/or argon as process gas.

Argon is particularly suitable for igniting and stabilising the plasma.

Helium leads to individual intensity peaks, in particular in the long-wave range of the uv spectrum.

Nitrogen leads to medium to high intensity in a broad range of the uv spectrum.

In particular, it can be provided that the plasma generation area contains a process gas, the composition of which varies during the curing process.

Thus, it can be provided, for example, that the composition of the process gas varies such that during a first phase of the curing process the centre of concentration of the electromagnetic radiation generated in the plasma during the curing process lies at a first wavelength and during a later, second phase of the curing process lies at a second wavelength, the second wavelength being different from the first wavelength.

It is particularly favourable if the second wavelength is less than the first wavelength.

As a result of this, in the first phase of the curing process electromagnetic radiation with a centre of concentration in the long-wave range is generated, which is particularly suitable for curing the coating on the work piece through its entire thickness.

During the second phase of the curing process, electromagnetic radiation is then generated, whose centre of concentration lies in the short-wave range and which is therefore particularly suitable for curing the covering layer of the coating close to the free surface in particular.

In a preferred configuration of the process according to the invention, it is therefore provided that the composition of the process gas is varied during the curing process such that the centre of concentration of the electromagnetic radiation generated in the plasma during the curing process shifts towards lower wavelengths as the curing period increases.

Thus, it can be provided, for example, that by corresponding control of the gas supply during a first phase of the curing process of approximately 60 seconds duration in the plasma generation area a process gas composition can be set which contains approximately 20% by volume of argon and the remainder helium. This process gas composition results in the centre of concentration of the spectrum of the electromagnetic radiation generated in the plasma lying in the long-wave uv range.

In a subsequent second phase of the curing process of approximately 30 seconds duration, for example, nitrogen can be added to this gas mixture in order to shift the centre of concentration of the spectrum of the electromagnetic radiation generated in the plasma towards lower wavelengths.

In addition, it has proved particularly favourable if at the time at which the plasma is ignited, the plasma generation area contains argon. Argon is particularly suitable as ignition gas for the formation of a plasma and for stabilising the plasma.

Therefore, in a particularly preferred configuration of the process according to the invention, it is provided that at the time at which the plasma is ignited, the plasma generation area essentially contains argon only.

To form the desired process gas composition, one or more gases and/or a gas mixture can be fed to the plasma generation area via one or more feeder devices.

So that the radiation distribution in the plasma generation area may also be adapted to complex non-planar work piece geometries, it can be provided that the plasma is generated by the input of electromagnetic radiation into the plasma generation area by means of several input devices, the arrangement of the input devices being such that when the plasma generation area is divided into two half sections by means of a horizontal plane running through the centre of concentration of the work piece during the curing process, at least one input device is present in each of the two half sections.

Alternatively or in addition to this, it can also be provided that when the plasma generation area is divided into two half sections by means of a vertical plane running through the centre of concentration of the work piece during the curing process, at least one input device is present in each of the two half sections.

So that the radiation distribution in the plasma generation area may be adapted as favourably as possible to complex non-planar work piece geometries and to spatially varying coating thicknesses, it can be provided that the plasma is generated by the input of electromagnetic radiation into the plasma generation area by means of several input devices, wherein at least two of the input devices have different input powers from one another.

Thus, it can be provided in particular that input devices with a high input power are disposed in the vicinity of regions of the work piece, which are provided with a coating of high thickness, whereas input devices with a lower input power can be disposed in the vicinity of regions of the work piece with a smaller coating thickness.

Moreover, it can be provided that the plasma is generated by the input of electromagnetic radiation into the plasma generation area by means of several input devices, wherein at least two of the input devices differ in design.

Thus, one input device can be configured, for example, as an ECR ("electron cyclotron resonance") plasma source and another input device can be configured as a high-frequency parallel plate plasma array.

To be able to homogenise the radiation distribution in the plasma generation area and/or to adapt it as favourably as possible to a specific work piece geometry, it can be provided that at least one reflector is provided in the plasma generation area to reflect the electromagnetic radiation generated in the plasma.

In particular, at least one mirror film can be provided as reflector in the plasma generation area.

Alternatively or in addition to this, it can be provided that at least a sub-region of the boundary walls of the plasma generation area is configured as a reflector.

It has proved particularly favourable if the at least one reflector comprises aluminum and/or stainless steel as reflective material.

To enable the reflector to be simply exchanged for another reflector with a different geometry or made of a different material, it is advantageous if the at least one reflector can be removed from the plasma generation area.

To enable a desired process gas flow pattern to be generated in the plasma generation area, it can be provided that gas is drawn off from the plasma generation area via one or more suction devices.

The pressure in the plasma generation area may also be varied in a simple manner with a constantly maintained gas supply if the pressure in the plasma generation area is varied by means of at least one suction device with a throttle valve arranged therein.

Depending on the material and geometry of the coated work piece, it can be of advantage to connect the work piece to a different electric potential from the electric potential of the boundary walls of the plasma generation area or to the same electric potential as the boundary walls of the plasma generation area.

In a particular configuration of the process according to the invention, it is provided that the work piece is electrically separated from the boundary walls of the plasma generation area by means of an at least partially electrically insulating holder.

As a result of such a configuration of the process it is possible to connect the work piece to a different electric potential from the electric potential of the boundary walls of the plasma generation area.

Alternatively, it can be provided that the work piece is electrically connected to the boundary walls of the plasma generation area by means of an electrically conductive holder.

As a result of this, it is possible in a simple manner to connect the work piece to the same electric potential as the boundary walls of the plasma generation area. In addition, it can be provided that the work piece and/or the boundary walls of the plasma generation area are connected to earth potential.

The generated plasma can be stabilised by suitable selection of the electric potential of the work piece with respect to the boundary walls of the plasma generation area.

In a special configuration of the process according to the invention it is additionally provided that the work piece is provided with a coating, which may be cured by electromagnetic radiation, which comprises at least a uv radiation component, or by heat or by a combination of electromagnetic radiation, which comprises at least a uv radiation component, and heat.

Such a coating is known, for example, as so-called "dual-cure lacquer".

By using such a coating it is possible to also cure by heat supply those areas of the coating of the work piece, which are not reached, or only inadequately reached, by the electromagnetic radiation generated in the plasma. In this case, the heat can be supplied, for example, by infrared radiation or convection. Moreover, heat can be supplied by means of the electromagnetic radiation generated in the plasma before, during and/or after curing.

In particular for the purpose of initial drying or subsequent curing, it can be provided that the work piece is subjected to an electromagnetic radiation, which is not generated in the plasma, before, during and/or after generation of the plasma.

Such a radiation can be in particular microwave radiation and/or infrared radiation.

To prevent bubbles from forming during curing of the coating in the case of coatings containing solvents, it can be provided that the work piece is dried before, after and/or during generation of the plasma.

Such drying can be effected, for example, by irradiation of the coating with microwave radiation and/or with infrared radiation.

Alternatively or supplementary to this, it can be provided that before generation of the plasma, the work piece is subjected to a pressure lying below atmospheric pressure, preferably to a pressure in the range of approximately 2000 Pa to approximately 50000 Pa.

By subjecting the work piece to such a reduced pressure, solvent can be evaporated out of the coating to be cured.

To maintain a low equipment expense for generation of a vacuum for such an initial drying, it is preferably provided that before generation of the plasma, the work piece is subjected to a pressure lying below atmospheric pressure, which is higher than the pressure, to which the work piece is subjected during generation of the plasma.

It can additionally be provided that a magnetic field is generated in the plasma generation area during the curing process, which can serve in particular to influence the local degree of ionisation of the plasma and thus the radiation distribution in the plasma generation area.

This magnetic field serving to influence the radiation distribution in the plasma generation area is generated independently of or possibly additionally to the magnetic field, which serves to utilise the ECR ("electron cyclotron resonance") effect and thus for generation of the plasma.

To be able to change the local degree of ionisation and thus the radiation distribution in the plasma generation area during the curing process, it is provided in a special configuration of the process according to the invention that the intensity of the magnetic field serving to influence the radiation distribution is varied during the curing process.

In particular it can be provided that the magnetic field is generated in the plasma generation area only after the start of the curing process.

As a result of such a magnetic field generated in a later phase of the curing process the effective curing time can be reduced in particular at points of the work piece that are especially exposed compared to other locations of the work piece.

This is particularly favourable in order to prevent yellowing when a light, in particular white, paint is used.

To enable the local degree of ionisation and thus the radiation distribution in the plasma generation area to be adapted as favourably as possible to the geometry of the work piece and the local coating thickness to be adapted on the work piece, it can be provided that the intensity of the magnetic field generated to influence the radiation distribution varies spatially in the plasma generation area.

Particularly in the case of heavy work pieces, it is advantageous if a transport device is provided, by means of which the work pieces can be transported into the plasma generation area and out of the plasma generation area again after the curing process.

A further object forming the basis of the present invention is to provide a device for curing a coating, in particular a radiation-curable coating, on a work piece, which also allows coatings on difficult to access locations of the work piece to be cured in a simple manner.

This object is achieved according to the invention with a device that comprises a plasma generation area, a device for bringing the work piece into the plasma generation area and a device for generating a plasma in the plasma generation area.

The plasma generated in the plasma generation area in particular can emit the radiation necessary for curing a radiation-curable coating.

Special configurations of the device according to the invention having have already been explained above in association with the special configurations of the process according to the invention.

Further features and advantages of the invention are the subject of the following description and the drawing representing embodiments.

FIG. 6 is a schematic side view of the device from FIGS. 4 and 5 in a first work cycle of the device;

FIG. 7 is a schematic side view of the device from FIGS. 4 and 5 in a first transport cycle;

FIG. 8 is a schematic side view of the device from FIGS. 4 and 5 in a second work cycle;

FIG. 9 is a schematic side view of the device from FIGS. 4 and 5 in a second transport cycle;

FIG. 10 is a schematic side view of the device from FIGS. 4 and 5 in a first work cycle after the second transport cycle:

Figure 17:
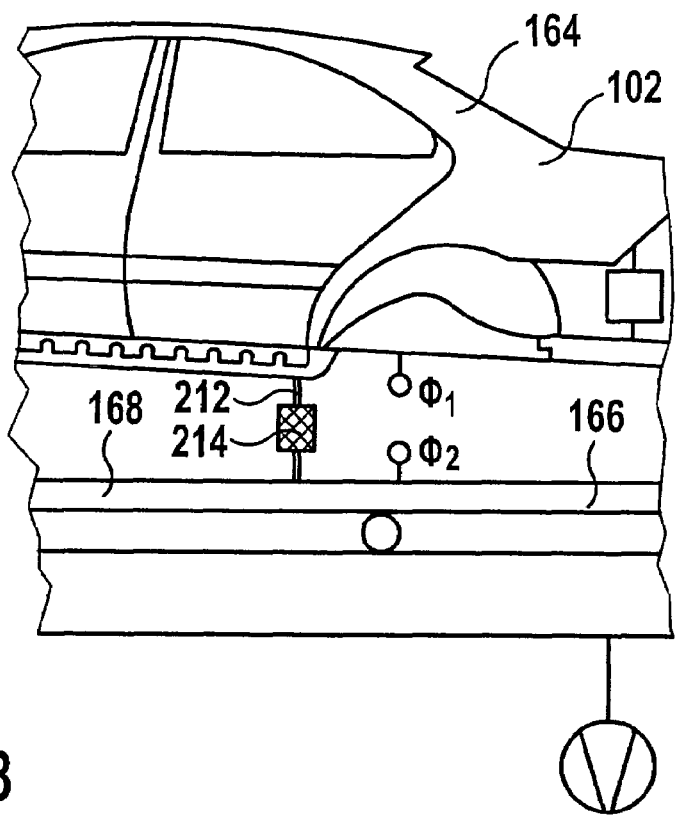
Figure 18:
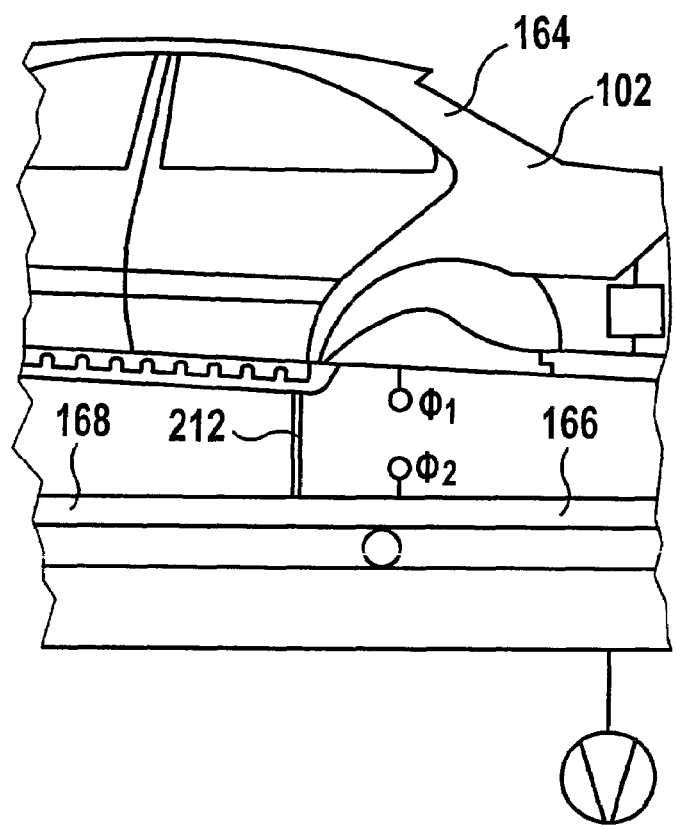

FIG. 17 is a schematic sectional side view of a vehicle body with a radiation-curable coating which is held on a skid frame by means of a work piece holder, said work piece holder comprising an electrical insulator; and FIG. 18 is a schematic sectional side view of a vehicle body with a radiation-curable coating which is held on a skid frame by means of a work piece holder, said vehicle body being connected to the skid frame in an electrically conductive manner via the work piece holder.

Identical or functionally equivalent elements are given the same reference numerals in all figures.

Figure 1:
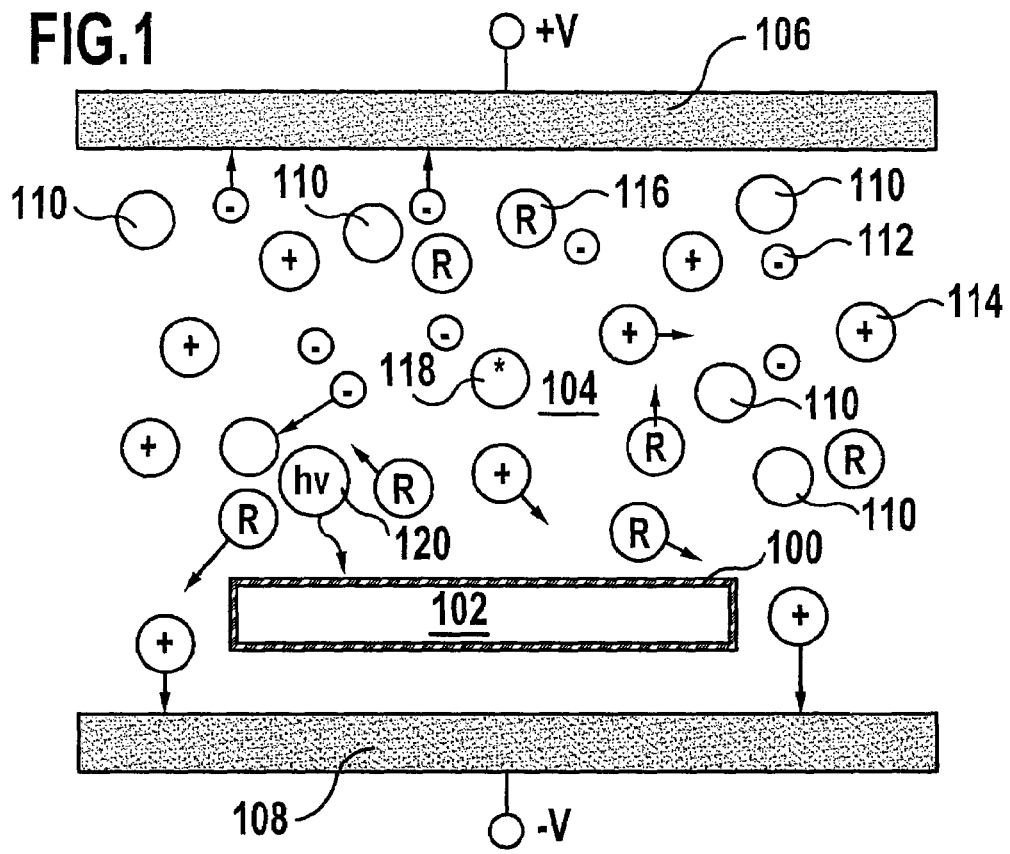
FIG. 1 is a schematic basic representation of the curing of a radiation-curable coating on a work piece in a plasma.

FIG. 1 shows the operating principle of a process for curing a radiation-curable coating 100 on a work piece 102, which is disposed in a plasma generation area 104.

The coating 100 is formed from a material, which may be cured by irradiation with ultraviolet radiation.

Formulations for such radiation-curable materials are known in the art and widely published. Hence, these formulations contain, for example, components to be polymerised such as monomers, oligomers and/or polymers, possibly binding agents, one or more photo-initiators, and possibly further usual paint additives such as, for example, solvents, flow-control agents, adhesion improvers, stabilisers, e.g. light protecting agents, uv absorbers.

Examples of suitable monomers are acrylates, possibly acrylates containing hydroxyl or epoxy groups. Unsaturated, possibly functionalised, amides, polyesters, polyurethanes and polyethers can serve as polymerisable components.

Such a radiation-curable formulation can be prepared, for example, by mixing the following components:

89.0 parts of 75% epoxy acrylate in hexane diol diacrylate (which is marketed under the name ®Ebecryl 604 by UCB, Belgium)

10.0 parts polyethylene glycol-400-diacrylate (which is marketed under the name ®Sartomer SR 344 by Sartomer)

1.0 part silicon diacrylate (which is marketed under the name ®Ebecryl 350 by UCB, Belgium)

2.0 parts phenyl-1-hydroxycyclohexyl-ketone (which is marketed under the name ®Irgacure 184 by Ciba Spezialitätenchemie, Switzerland).

This material can be cross-linked and therefore cured by irradiating with visible light and with uv light in the wavelength range of approximately 200 nm to approximately 600 nm.

The work piece 102, which can be formed from any desired metallic or non-metallic material, is provided with a coating of the radiation-curable material, that is initially not yet cured, in a suitable manner, e.g. by dip-coating, spray painting or by spraying.

The coated work piece 102 is brought into a plasma generation area 104, which is filled with a process gas, e.g. argon or nitrogen, at an operating pressure in the range of approximately 0.1 Pa to approximately 100 Pa.

After the work piece 102 has been brought into the plasma generation area 104 and the aforementioned low pressure has been set in the process gas, a plasma is generated in the plasma generation area 104 either by applying a static electric field to the plasma generation area 104, as is schematically shown in FIG. 1 by electrodes 106 and 108, and/or by the input of an electromagnetic alternating field into the plasma generation area.

In particular, it can be provided that electromagnetic radiation is input into the plasma generation area 104. The frequency of this electromagnetic radiation can lie in the microwave range (from approximately 300 MHz to approximately 300 GHz) or in the high-frequency range (from approximately 3 kHz to approximately 300 MHz).

The neutral particles (atoms or molecules) 110 of the process gas are ionised by collision by electrons, which absorb energy in the applied static electric field or in the input electromagnetic alternating field, so that additional free electrons 112 and gas ions 114 are formed.

Radicals 116 and stimulated gas particles (atoms or molecules) 118 are formed as a result of collisions of the free electrons 112 and the gas ions 114 with further neutral gas particles.

These stimulated particles of the plasma emit a portion of the energy transferred to them in the form of electromagnetic radiation 120, which has at least partially a wavelength in the visible range and in the uv range (from approximately 200 nm to approximately 600 nm).

A portion of this emitted uv radiation passes out of the plasma to the coating 100 of the work piece 102 disposed inside the plasma, is absorbed there and triggers a cross-linking reaction, e.g. a polymerisation, polycondensation or polyaddition reaction, which leads to curing of the coating 100.

When the coating 100 has received a sufficient dose of uv radiation to effect adequate curing of the coating 100, the supply of energy to the plasma is interrupted so that a neutral process gas atmosphere results, the pressure in the plasma generation area 104 is brought to atmospheric pressure and the work piece 102 with the cured coating 100 is removed from the plasma generation area 104.

Figure 2:
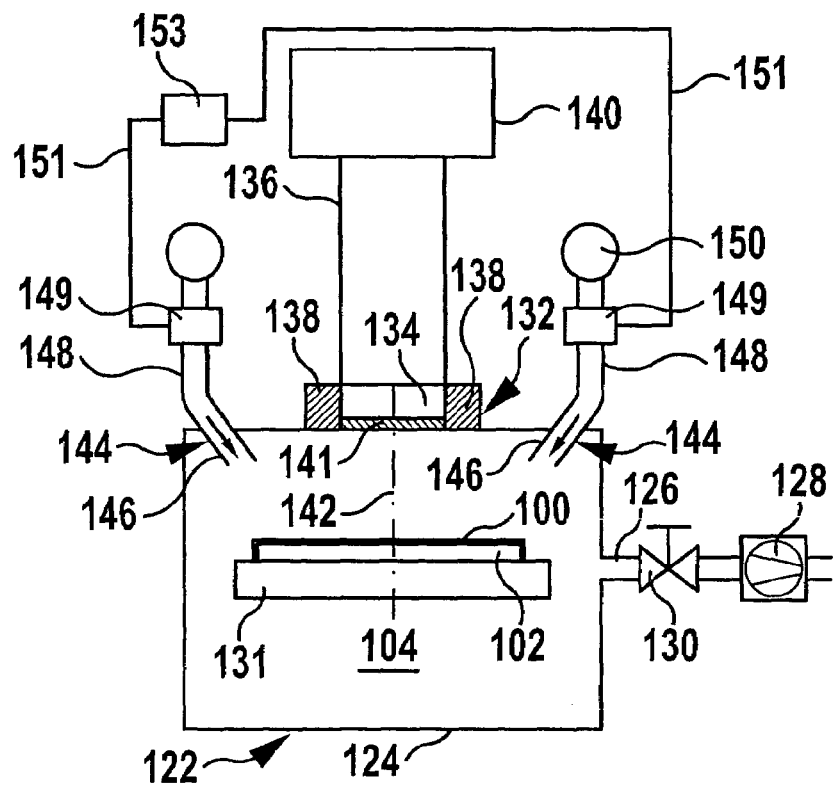
FIG. 2 is a schematic sectional view of a first embodiment of a device for curing a radiation-curable coating on a work piece.

A device shown schematically in FIG. 2 and given the overall reference 122, for curing a radiation-curable coating 100 on a work piece 102 comprises a gastight plasma chamber 124, the interior of which forms a plasma generation area 104.

The plasma chamber 124 can have an inside volume of approximately 100 liters, for example.

The plasma chamber 124 may be evacuated to a pressure of approximately $10^{-3}$ Pa via a suction pipe 126, which leads to a vacuum pump system 128 and may be shut off by a non-return valve 130.

The work piece 102 held on a work piece holder 131 and provided, for example, in the form of a silicon disc, which is provided on its upper side remote from the work piece holder 131 with a coating 100 made of the aforementioned radiation-curable material, may be brought into the operating position shown in FIG. 2 via an access door (not shown) of the plasma chamber 124.

An input device for microwave radiation, given the overall reference 132, which comprises an antenna 134 disposed in a waveguide section 136 and a magnetising coil array 138, is disposed centrally above the work piece 100 located in the operating position.

The antenna 134 is connected via the waveguide section 136 to a magnetron 140, which generates microwaves with a frequency of 2.45 GHz, for example, which pass to the antenna 134 via the waveguide section 136 and from there are input into the plasma generation area 104.

The waveguide section 136 is separated from the plasma generation area 104 by a quartz window 141.

The magnetising coil array 138 serves to amplify the ionising effect of the microwave radiation by the ECR ("electron cyclotron resonance") effect.

The magnetising coil array 138 generates a static magnetic field, which inside the plasma generation area 104 is oriented essentially parallel to the axis 142 of the microwave radiation beam transmitted by the antenna 134. The intensity of the magnetic field is set such that the cyclotron frequency of the electrons in the magnetic field corresponds to the frequency of the irradiated microwaves. In this resonance case, the free electrons absorb a particularly large amount of energy from the electromagnetic alternating field, which leads to a particularly efficient ionisation of the process gas.

If microwave radiation with a frequency of 2.45 GHz is used, then a magnetic field with an intensity of 875 gauss must be used in order to achieve the ECR effect.

Several feeder devices 144 for the process gas are disposed symmetrically to the axis 142 of the microwave radiation beam generated by the input device 132, these feeder devices respectively comprising a feeder nozzle 146 directed into the plasma chamber 124 in a sealed manner and connected to a gas reservoir 150 respectively via a feed pipe 148 with a mass current regulator 149. Naturally, several feeder devices 144 may also be connected to the same gas reservoir 150.

Each of the mass current regulators 149 is respectively connected via a control line 151 to a control unit 153, which controls the total amount of the process gas fed to the plasma generation area 104 in dependence on the required amount of radiation.

An ECR plasma source, which is marketed under the name RR 250 by Roth & Rau Oberflächentechnik AG, D-09337 Hohenstein-Ernstthal, Germany, can be used in particular as input device 132.

The above-described device 122 is operated as follows:

After the work piece 102, which is provided with a not yet cured coating 100 and is held on the work piece holder 131, has been placed into the plasma chamber 124, this is evacuated by means of the vacuum pump system 128 to a base pressure of approximately $10^{-3}$ Pa after opening the non-return valve 130.

Process gas from the gas reservoirs 150 is then let into plasma generation area 104 via the feeder devices 144 until an operating pressure of approximately 0.3 Pa, for example, is reached.

In this case, the gas flow into the plasma chamber 124 is controlled by means of the mass current regulator 149 so that the gas flux into the plasma chamber 124 overall amounts to approximately 10 sccm to approximately 100 sccm (standard cubic centimeters per minute).

Argon or nitrogen are used, for example, as process gas.

When the desired operating pressure is reached, the microwave radiation generated by the magnetron 140 is input into the plasma generation area 104 and the plasma in the plasma generation area 104 is thus ignited.

The input microwave power amounts, for example, to approximately 400 watts to approximately 1000 watts, preferably up to approximately 600 watts.

If several input devices 132 are used, then the microwave power input per input device preferably respectively amounts to approximately 400 watts to approximately 1000 watts, in particular up to approximately 600 watts.

The gas particles fed into the plasma chamber 124 are ionised in the microwave radiation beam and from there drift further through the plasma generation area 104 so that essentially the whole plasma chamber 124 is filled with plasma.

As a result of collisions of the charged particles with the gas particles stimulated in the plasma, radiation in the uv range is emitted, which is absorbed by the coating 100 and triggers the cross-linking reactions there, which lead to curing of the coating 100.

After an exposure time of 90 seconds, for example, the plasma treatment is interrupted and the plasma chamber 124 aerated.

The work piece 102 with the cured coating 100 is removed.

Two concrete practical examples of a curing process conducted with the above-described device 122 are specified below:

EXAMPLE 1

A photo-curable formulation is produced by mixing the following components:
44.5 parts of an aliphatic urethane acrylate (Ebecryl 284; 88 parts aliphatic urethane acrylate/12 parts hexane diol diacrylate; Bayer AG)
32.2 parts of an aliphatic urethane-tri/tetra-acrylate (Roskydal UA VP LS 2308; Bayer AG)
50.0 parts isopropanol
1.5 parts of a flow-control agent (Byk 306; Byk Chemie)

The following are added to the formulation specified in the table and stirred on the water bath at 40° C.: 2.7% 1-hydroxy-cyclohexyl-phenyl ketone (Irgacure 184, Ciba Spezialitätenchemie), 0.5% bis(2,4,6-trimethylbenzoyl) phenylphosphine oxide (Irgacure 819, Ciba Spezialitätenchemie), 1.5% tinuvin 400 (=mixture comprising 2-[4-[(2-hydroxy-3-dodecyloxypropyl)oxy]-2-hydroxyphenyl]-4,6-bis(2,4-dimethylphenyl)-1,3,5-triazine and 2-[4-[(2-hydroxy-3-tridecyloxypropyl)oxy]-2-hydroxyphenyl]-4,6-bis(2,4-dimethylphenyl)-1,3,5-triazine, Ciba Spezialitätenchemie) and 1% tinuvin 292 (=mixture comprising bis(1,2,2,6,6-pentamethyl-4-piperidinyl)-sebacate and 1(methyl)-8-(1,2,2,6,6-pentamethyl-4-piperidinyl)-sebacate, Ciba Spezialitätenchemie) (calculated on the basis of solids). A coil coat aluminum is brought into the shape of an inverted U. The paint is applied by means of spray application so that a resulting dry layer thickness of 30 µm is obtained. The paint on the three-dimensional substrate is exhaust-ventilated for 5 minutes at room temperature, then exhaust-ventilated in a forced-air oven for 10 minutes at 80° C. and then cured in the plasma chamber 124. Curing occurs in an $N_2$/He atmosphere with a gas ratio of 135/65 sccm, the microwave power input with a microwave antenna corresponding to 500 w for 90 seconds. The distance of the sample from the microwave antenna amounts to 150 mm. A well cured tack-free coating is obtained. The degree of curing is determined by means of the König pendulum hardness (DIN 53157). The higher the value for the pendulum hardness, the harder the coating. The left side of the U-shaped metal sheet has a pendulum hardness of 67 s, the right side a pendulum hardness of 91 s. On the top of the U-shaped sheet the pendulum hardness reaches the value of 126 s.

EXAMPLE 2

Components A and B are produced by mixing the following constituents:
Component A:
11.38 parts of a polyacrylate containing hydroxyl groups; 70% in butyl acetate (Desmophen A 870, Bayer AG)
21.23 parts polyester polyol 75% in butyl acetate (Desmophen VP LS 2089, Bayer AG)
0.55 parts of a flow-control agent (Byk 306, Byk Chemie)
32.03 parts methanol The following photo-initiators and light protection agents are stirred into component A:
0.17 parts bis(2,4,6-trimethylbenzoyl) phenylphosphine oxide (Irgacure 819, Ciba Spezialitätenchemie)
1.52 parts 1-hydroxy-cyclohexyl-phenyl ketone (Irgacure 184, Ciba Spezialitätenchemie)
0.85 parts tinuvin 400 (=mixture comprising 2-[4-[(2-hydroxy-3-dodecyloxypropyl)oxy]-2-hydroxyphenyl]-4,6-bis(2,4-dimethylphenyl)-1,3,5-triazine and 2-[4-[(2-hydroxy-3-tridecyloxypropyl)oxy]-2-hydroxyphenyl]-4,6-bis(2,4-dimethylphenyl)-1,3,5-triazine, Ciba Spezialitätenchemie)
0.56 parts tinuvin 292 (=mixture comprising bis(1,2,2,6,6-pentamethyl-4-piperidinyl)-sebacate and 1-(methyl)-8-(1,2,2,6,6-pentamethyl-4-piperidinyl)-sebacate, Ciba Spezialitätenchemie)
Then
32.09 parts of a urethane acrylate containing isocyanate groups (Roskydal UA VP LS 2337, Bayer AG)
are added to component B and homogeneously distributed.

In this manner, a dual-cure lacquer is produced.

The lacquer is applied with a 100 µm slotted coating blade onto a planar coil coat aluminum so that a dry layer thickness of 30 µm is obtained. The lacquer is exhaust-ventilated for 5 minutes at room temperature, then thermally cross-linked in a forced-air oven for 15 minutes at 120° C. and then cured in the plasma chamber 124. Curing occurs in an $N_2$/Ar atmosphere with a gas ratio of 160/40 sccm, the microwave power corresponding to 800 w for 90 seconds. The distance of the sample from the microwave antenna amounts to 150 mm. A well cured tack-free coating is obtained. The degree of curing is determined by means of the König pendulum hardness (DIN 53157). The higher the value for the pendulum hardness, the harder the coating. A value of 118 s is obtained.

A high-frequency parallel plate plasma array comprising a parallel plate electrode system, which is disposed at a distance from the work piece in the plasma generation area, could also be used in the device 122 in place of the above-described ECR plasma source. In this case, the plasma is ignited by applying a high-frequency alternating voltage, for example, of approximately 13.6 MHz between the parallel plate electrode array and the work piece holder. The supplied power amounts, for example, to approximately 10 watts to approximately 200 watts. The preferred operating pressure amounts to approximately 1 Pa and is set by means of the mass current regulators in the feed pipes by feeding in the gas to be ionised, preferably argon.

Otherwise, the variant of the device operated with high frequency is the same with respect to its structure and function as the variant operated with microwaves, and reference should be made to the above description thereof in this regard.

Figure 3:
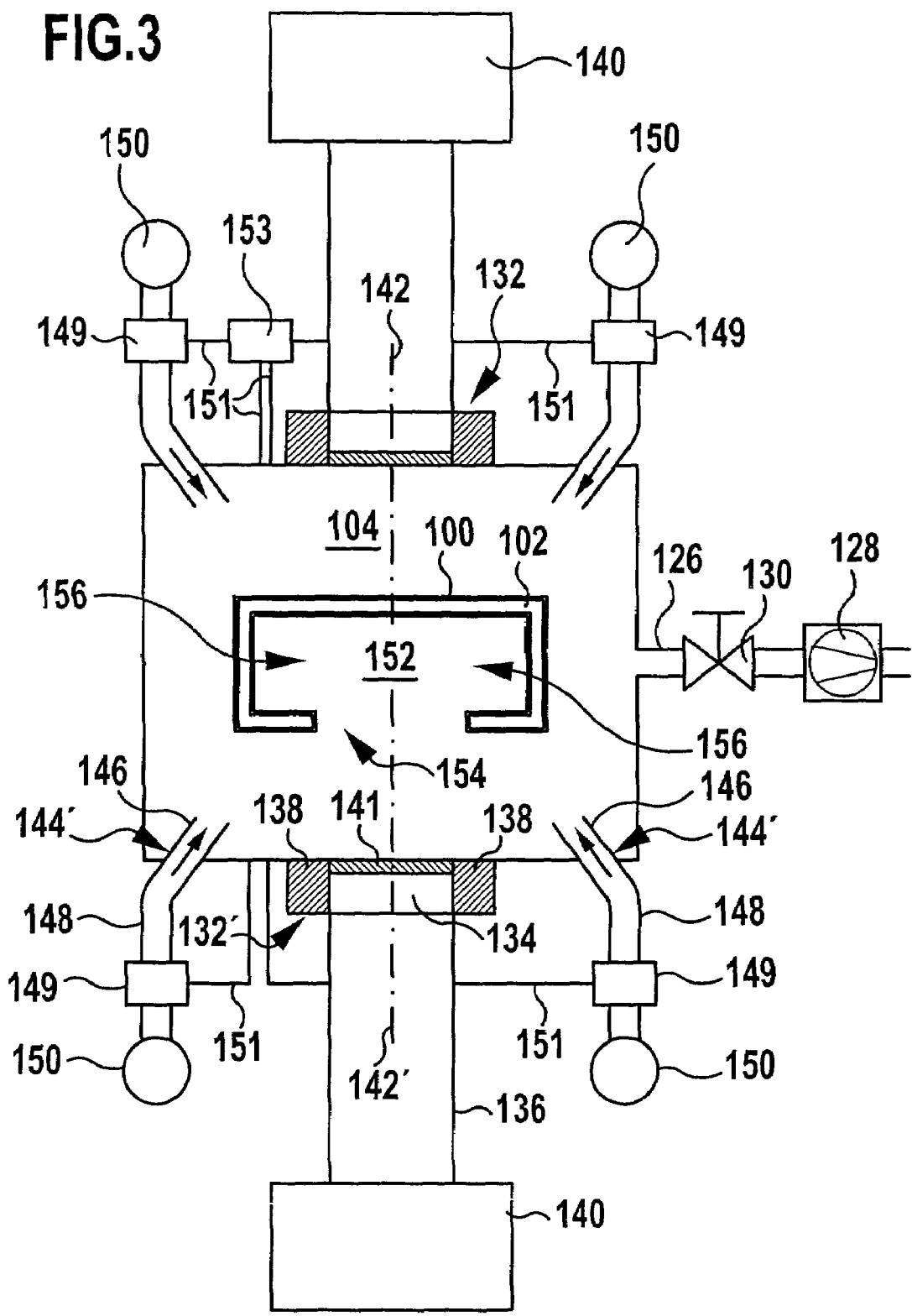
FIG. 3 is a schematic sectional view of a second embodiment of a device for curing a radiation-curable coating on a work piece.

A second embodiment of a device 122 for curing a radiation-curable coating 100 on a work piece 102 shown schematically in FIG. 3 differs from the above-described first embodiment in that in addition to the first input device 132 above the operating position of the work piece 102 a second input device 132' is disposed on the opposite side of the plasma chamber 124 to the first input device 132.

The second input device 132' corresponds in structure to the first input device 132 and in particular comprises an antenna 134 in a waveguide section 136, which leads to a magnetron 140 and is separated from the plasma generation area 104 by a quartz glass sheet 141, and also a magnetising coil array 138 for generation of the ECR effect.

In addition, several feeder devices 144' for the process gas are disposed symmetrically to the axis 142' of the microwave radiation beam generated by the second input device 132', these feeder devices respectively comprising a feeder nozzle 146 directed into the plasma generation area 104 in a sealed manner and connected to a gas reservoir 150 respectively via a feed pipe 148 with a mass current regulator 149.

Each of the mass current regulators 149 is respectively connected via a control line 151 to the control unit 153, which controls the total amount of the process gas fed to the plasma generation area 104 in dependence on the required amount of radiation.

The second embodiment of a device 122 shown in FIG. 3 also allows coatings 100 on complex shaped, three-dimensional work pieces 102 to be cured, which, like the work piece 102 shown in FIG. 3, for example, have a cavity 152 with an access opening 154, wherein the boundary surfaces of the cavity are also provided with the coating 100 to be cured.

The work piece 102 is disposed in the plasma generation area 104 in such a way that the access opening 154 of the cavity 152 lies opposite the second input device 132' and the axis 142' of the input device 132' points through the access opening 154 into the cavity 152.

This ensures that the microwave radiation from the second input device 132' reaches into the cavity 152 of the work piece 102 so that a plasma is also generated in the cavity 152.

The gas particles stimulated by collisions with the charged particles of the plasma also reach by diffusion into the shaded regions 156 of the cavity 152, into which no visible or uv radiation can reach from the region of the plasma generation area 104 located outside the work piece 102, and there emit visible and uv radiation, which is absorbed by the coating 100 on the inside walls of the shaded regions 156 of the cavity 152. In this way, the coating 100 in these shaded regions 156 can also be fully cured.

Otherwise, the second embodiment of a device 122 for curing a radiation-curable coating 100 shown in FIG. 3 is the same with respect to its structure and function as the first embodiment shown in FIG. 2, and reference should be made to the above description thereof in this regard.

Figure 4:
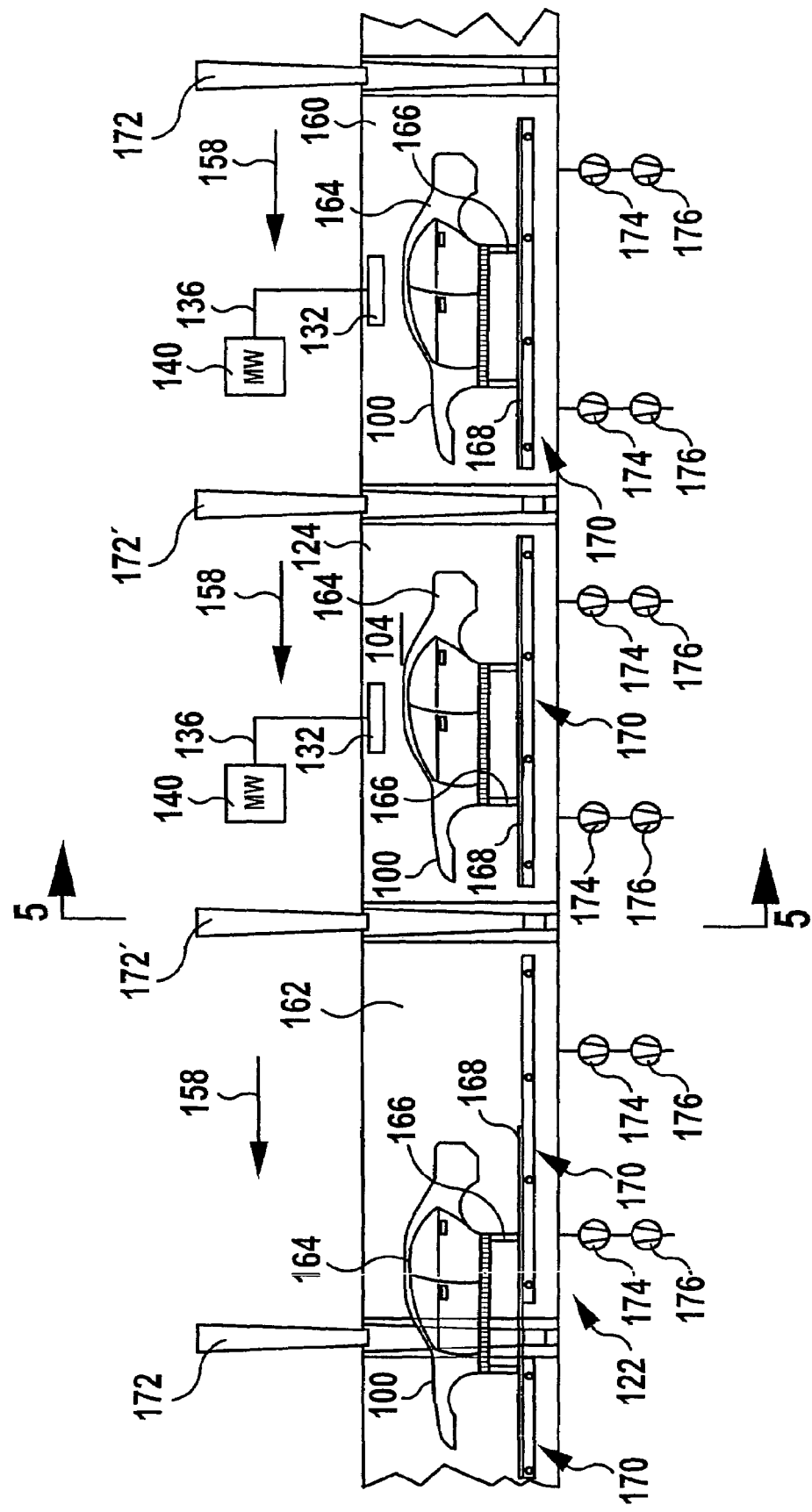
FIG. 4 is a schematic longitudinal section through a third embodiment of a device for curing a radiation-curable coating which serves to cure a radiation-curable coating on vehicle bodies and comprises a feed chamber, a plasma chamber and a discharge chamber.
Figure 5:
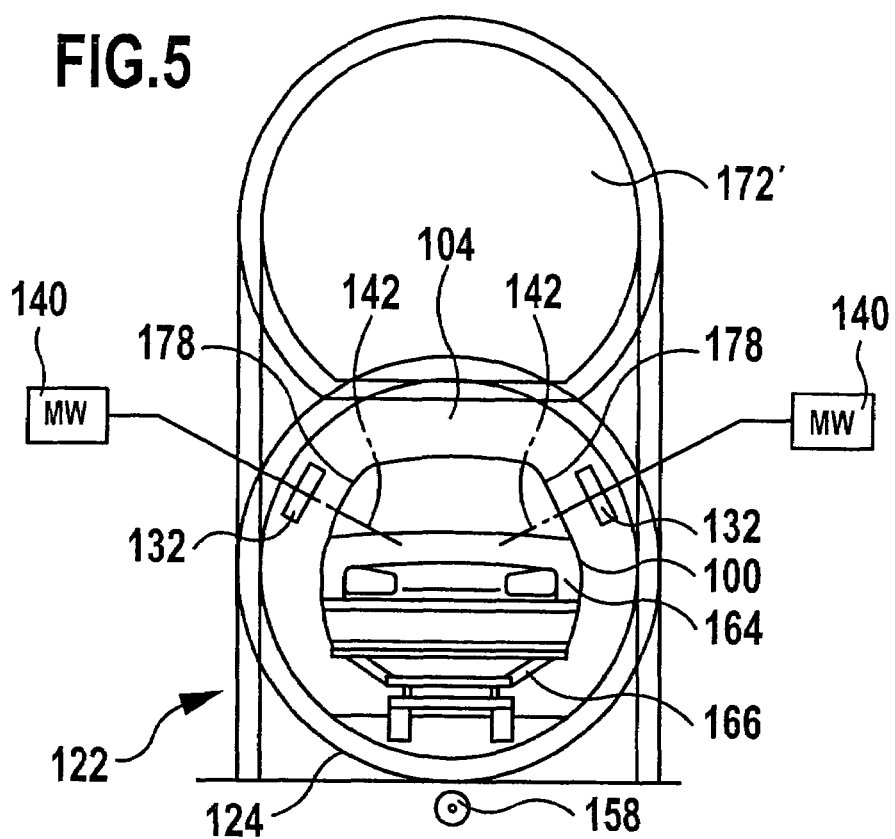
FIG. 5 is a schematic cross-sectional view through the device from FIG. 4 along line 5-5 in FIG. 4.

A third embodiment of a device for curing a radiation-curable coating on a work piece 164 shown in FIGS. 4 and 5 comprises three chambers, which can be evacuated and are arranged consecutively in a transport direction 158, namely an antechamber or feed chamber 160, a plasma chamber 124 and a discharge chamber 162.

Each of these chambers has a diameter of approximately 2.5 m and a length of approximately 6 m, so that each chamber can respectively receive a work piece in the form of a vehicle body 164, which is held on a skid frame 166.

Each skid frame comprises two skids 168 oriented parallel to the transport direction 158, with which the respective skid frame 166 may be supported on the transport rollers of roller conveyors 170, one of which is respectively disposed in each of the chambers 160, 124 and 162.

The inlet of the feed chamber 160 and the outlet of the discharge chamber 162 may be respectively sealed by a vacuum-tight outer lifting gate 172. The passage from the feed chamber 160 into the plasma chamber 124 and the passage from the plasma chamber 124 into the discharge chamber 162 may be sealed respectively by a vacuum-tight inner lifting gate 172'.

These lifting gates 172, 172' are shown in their upper open position in FIGS. 4 and 5, in which the said passages are opened for the vehicle bodies 164.

Each of the chambers 160, 124 and 162 may be evacuated to an operating pressure of approximately 1 Pa by means of a respective fore-pump 174 and a respective Roots blower 176.

The plasma chamber 124 is provided with several input devices 132 for microwave radiation, one of which is disposed centrally above the vehicle body 164 disposed in the plasma chamber 124 and two further input devices are disposed on the side walls of the plasma chamber 124 such that they lie opposite window openings 178 of the vehicle body 164 so that the axes 142 of the microwave radiation beams generated by these input devices point through the window openings 178 into the interior of the vehicle body 164.

Each of the input devices 132 is connected respectively via a waveguide section 136 to a magnetron 140 for the generation of microwaves with a frequency of 2.45 GHz.

In addition, disposed adjacent to each of the input devices 132 are gas spray systems (not shown), which are connected to gas reservoirs via feed pipes and through which a process gas, e.g. nitrogen or argon, may be fed into the plasma chamber 124 during the curing process.

An input device 132 for microwave radiation, which is connected to a magnetron 140 via a waveguide section 136 and is disposed centrally above the vehicle body 164 disposed in the feed chamber 160, is also provided in the feed chamber 160.

The input devices 132 are displaceable inside the plasma chamber 124 or inside the feed chamber 160 so that they can be positioned in optimum fashion in dependence on the geometry of the vehicle body 164, in particular can be brought as close as possible to the window openings.

The above-described device 122 for curing radiation-curable coatings on vehicle bodies 164 functions as follows:

The device is operated in fixed cycles, wherein a first work cycle, a first transport cycle, a second work cycle and a second transport cycle respectively follow one another in succession and form an operation cycle of the device.

The total cycle time, i.e. the sum of the duration of both work cycles and both transport cycles, amounts to approximately 90 seconds.

During the first work cycle shown schematically in FIG. 6, all lifting gates 172, 172' are closed. A vehicle body 164 is disposed in the discharge chamber 162 and a further vehicle body 164' is disposed in the plasma chamber 124.

In a first work cycle, the discharge chamber 162 is aerated until ambient pressure is reached therein.

In the first work cycle the vehicle body 164' in the plasma chamber 124 is subjected to a plasma curing process, in which the process gas is fed via the gas spray systems into the interior of the plasma chamber 124 serving as plasma generation area 104 and the plasma is ignited by means of the microwave radiation from the magnetrons 140.

Those regions of the coating 100 of the vehicle body 164' which directly adjoin a region of the plasma generation area 104, in which plasma has ignited, are irradiated from this region with visible radiation and uv radiation.

In addition, gas particles stimulated by collisions with charged particles of the plasma also diffuse into the shaded regions in the interior of the vehicle body 164', and there emit visible light and uv light, so that the coating 100 is also cured in these shaded regions 156.

The microwave power fed into the plasma chamber 124 during the curing process amounts to approximately 10 kW in total.

The empty feed chamber 160 is aerated during the first work cycle until the ambient pressure is reached therein.

In the first transport cycle, shown in FIG. 7, following the first work cycle, the outer lifting gates 172 are opened. A new vehicle body 164" is then transported out of the area of a painting plant located in front of the feed chamber 160 in the transport direction 158, in which the vehicle body 164" has been provided with a coat of radiation-curable material, which has the aforementioned composition, for example, into the feed chamber 160, while the vehicle body 164 located in the discharge chamber 162 in the first work cycle is transported on into the area of the painting plant after the discharge chamber 162 by means of the roller conveyor 170.

During the first transport cycle the vehicle body 164' remains in the plasma chamber 124, the plasma curing process being continued during the first transport cycle.

The second work cycle of the device shown in FIG. 8 follows the first transport cycle, and in this all the lifting gates 172, 172' are closed again.

In the second work cycle, the plasma curing process is continued on the vehicle body 164' in the plasma chamber 124.

In addition, during the second work cycle, the feed chamber 160 and the discharge chamber 162 are evacuated by means of the respective fore-pump 174 and the respective Roots blower 176 from atmospheric pressure to an operating pressure of approximately 100 Pa. This evacuation results in pre-drying of the coating 100 present in the form of the coat of paint on the vehicle body 164 in the feed chamber 160.

In addition, microwave radiation from the magnetron 140 can be input into the feed chamber 160 by means of the input device 132 in order to dry the coating 100 directly by microwave radiation, or if desired, to ignite a plasma in the feed chamber 160, which emits visible radiation and uv radiation into the coating and thus effects a first curing process of the coating.

After the provided exposure time of the vehicle body 164' in the plasma chamber of approximately 60 seconds, for example, has ended, the energy supply to the plasma is interrupted and the gas supply adjusted.

In the second transport cycle, shown in FIG. 9, following the second work cycle, the inner lifting gates 172' are opened while the outer lifting gates 172 remain closed.

In the second transport cycle the vehicle body 164' is transported out of the plasma chamber 124 into the discharge chamber 162 by means of the roller conveyors in the plasma chamber 124 and the discharge chamber 162.

At the same time, in the second transport cycle the vehicle body 164" is transported out of the feed chamber 160 into the plasma chamber 124 by means of the roller conveyors in the feed chamber 160 and the plasma chamber 124.

The inner lifting gates 172' are then closed and the operation cycle of the device 122 begins again with a first work cycle (FIG. 10), in which the vehicle body 164" in the plasma chamber 124 is subjected to a plasma curing process and the discharge chamber 162 as well as the feed chamber 160 are aerated again until the ambient pressure is reached therein.

To supplement the plasma curing in the plasma chamber 124, it can also be provided that the vehicle bodies are thermally pre-treated in the feed chamber 160 and/or thermally after-treated in the discharge chamber 162.

The thermal pre- or after-treatment can in particular comprise a separate thermal curing process, in which the coat is heated by heat supply, e.g. by means of thermal convection and/or by irradiation with infrared light, to a temperature in the range, for example, of approximately 50° C. to approximately 250° C., and thus cured.

In addition, the vehicle bodies may also be thermally treated before, during and/or after the plasma curing process, e.g. by heating the coat of paint by irradiation with infrared light.

Figure 12:
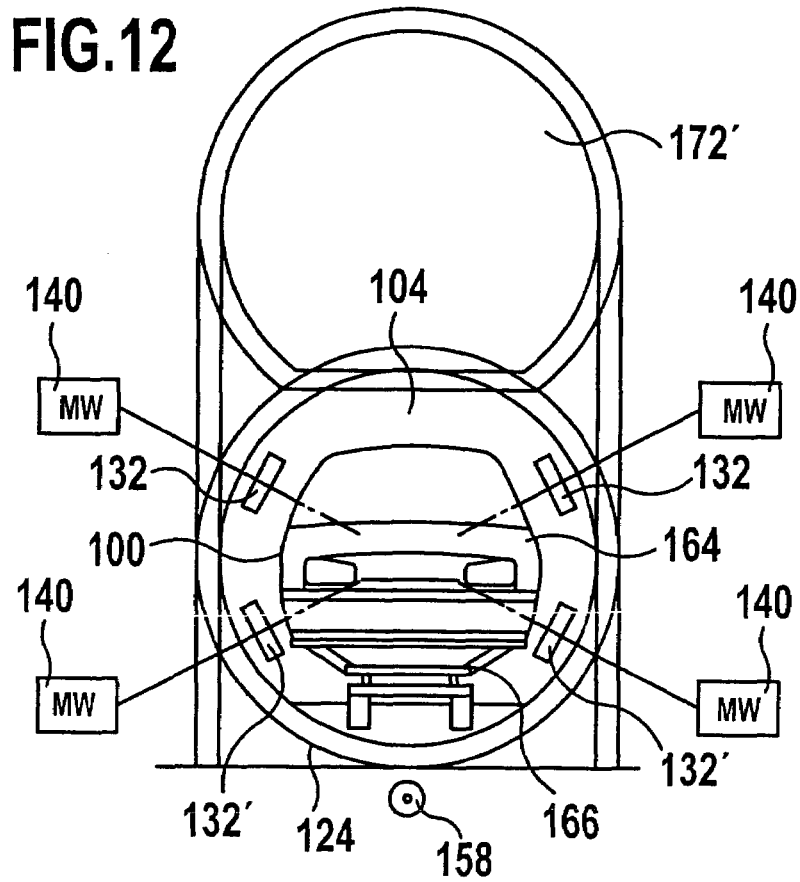
FIG. 12 is a schematic cross-sectional view through the device from FIG. 11 along line 12-12 in FIG. 11.
Figure 11:
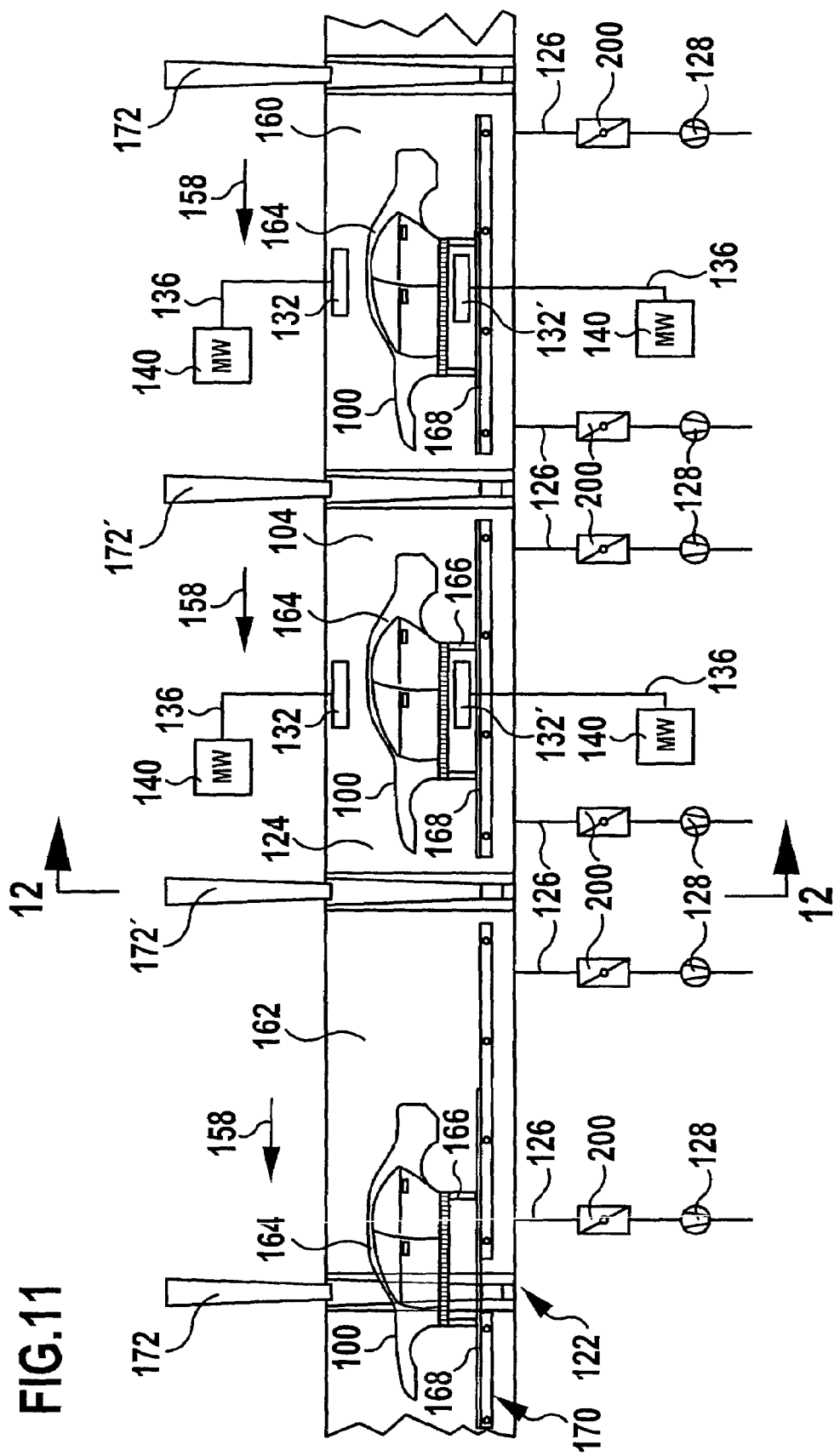
FIG. 11 is a schematic longitudinal section through a fourth embodiment of a device for curing a radiation-curable coating which serves to cure a radiation-curable coating on vehicle bodies and comprises a feed chamber, a plasma chamber and a discharge chamber.

A fourth embodiment of a device for curing a radiation-curable coating 100 on a work piece 102 shown in FIGS. 11 and 12 differs from the third embodiment shown in FIGS. 4 and 5 in that in addition to the input devices 132 for microwave radiation, which are disposed above the horizontal longitudinal central plane of the vehicle bodies 164 with the radiation-curable coating 100, additional input devices 132' are provided, which are disposed below the horizontal longitudinal central plane of the vehicle bodies 164, which is best seen from FIG. 12.

Each of these additional input devices 132' is also connected via a respective waveguide section 136 to a magnetron 140 for the generation of microwaves with a frequency of 2.45 GHz.

The different input devices 132, 132' may all be of the same design.

However, alternatively it is also possible to provide that at least two of these input devices 132, 132' differ in design and/or with respect to the microwave power input into the plasma generation area 104.

In particular it can be provided that an input device 132 or 132', which is located in the vicinity of a region of the vehicle body 164, in which the thickness of the coating 100 is comparatively large, has a higher input power than an input device 132 or 132', which is located in the vicinity of a region of the vehicle body 164, in which the thickness of the coating 100 is less.

Moreover, in this fourth embodiment a throttle valve 200 can be respectively provided in the suction pipes 126 between the plasma chamber 124, the feed chamber 160 and the discharge chamber 162, on the one hand, and the vacuum pumps 128, by means of which the respective chamber 124 may be evacuated, on the other.

Because of the throttle valves 200 disposed on the suction side, the pressure in the plasma chamber 124 or feed chamber 160 or the discharge chamber 162 can be varied even with constant gas supply to the respective chamber. In this way, a desired pressure profile that varies in time can be generated in each of the chambers without any control or regulation of the gas supply to the respective chamber being necessary for this.

The condition of the plasma in the plasma chamber 124 can be homogenised by increasing the number of input devices 132, 132' and/or as a result of the input power of the input devices 132, 132' adapted to the respective local coating thickness.

Otherwise, the fourth embodiment of a device for curing a radiation-curable coating is the same with respect to structure and function as the third embodiment, and reference should be made to the above description thereof in this regard.

Figure 13:
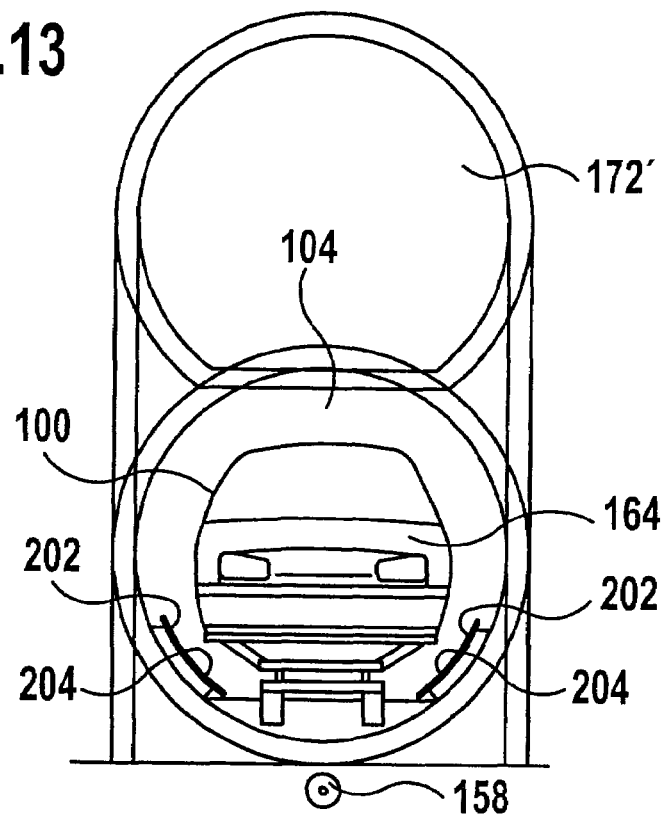
FIG. 13 is a schematic cross-sectional view through a fifth embodiment of a device for curing a radiation-curable coating which serves to cure a radiation-curable coating on vehicle bodies and comprises reflectors.

A fifth embodiment of a device for curing a radiation-curable coating 100 on a work piece 102 shown in FIG. 13 differs from the above-described third embodiment only in that reflectors 202 inside the plasma chamber 124 are provided with a respective reflection surface 204 facing the vehicle bodies 164.

The reflectors 202 serve to reflect the electromagnetic radiation generated in the plasma towards the vehicle bodies 164 and thus homogenise the radiation distribution in the plasma chamber 124.

Moreover, it is possible by means of the reflectors 202 to also subject difficult to access shaded regions of the vehicle bodies 164 to an adequate amount of electromagnetic radiation.

The reflection surfaces 204 can be formed, for example, from aluminum or stainless steel or provided with a mirror film made of one of these materials.

The reflectors 202 are preferably detachably held on the walls of the plasma chamber 124 so that the reflectors 202 can be removed from the plasma chamber 124 and exchanged for other reflectors 202.

Otherwise, the fifth embodiment of a device for curing a coating on a work piece is the same with respect to structure and function as the third embodiment, and reference should be made to the above description thereof in this regard.

Figure 14:
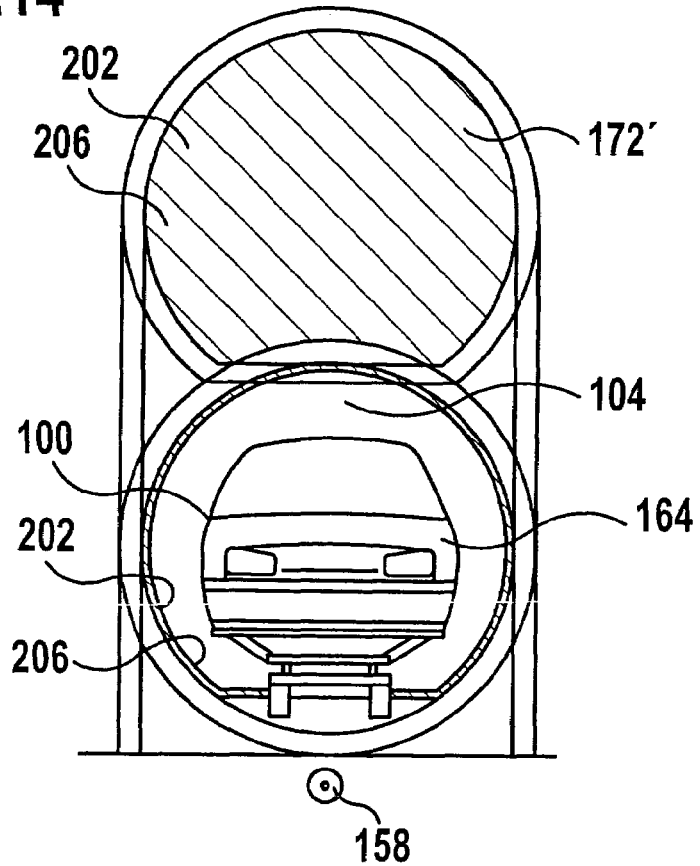
FIG. 14 is a schematic cross-sectional view through a sixth embodiment of a device for curing a radiation-curable coating on a work piece which serves to cure a radiation-curable coating on vehicle bodies and comprises a plasma chamber with reflective chamber walls.

A sixth embodiment of a device for curing a radiation-curable coating on vehicle bodies 164 shown in FIG. 14 differs from the above-described fifth embodiment in that the boundary walls of the plasma chamber 124 (including the wall surfaces of the inner lifting gates 172' facing the interior of the plasma chamber 124 are provided with a reflective coating 206 so that in this embodiment the boundary walls of the plasma chamber 124 itself serve as reflectors 202, which reflect electromagnetic radiation generated in the plasma generation area 104 towards the work piece 102.

The reflective coatings 206 can be formed, for example, from aluminum or stainless steel.

Moreover, it can be provided that the boundary walls of the plasma chamber 172 are not provided with a reflective coating but are formed completely from a reflective material.

The reflectors of the fifth embodiment provided separately from the boundary walls of the plasma chamber 124 may be omitted in the sixth embodiment. However, it would also be conceivable to arrange additional reflectors 202, as are described in association with the fifth embodiment, inside the plasma chamber 124 with the reflective boundary walls in order to purposefully influence the radiation distribution in the plasma chamber 124, where necessary.

Otherwise, the sixth embodiment of a device for curing a radiation-curable coating is the same with respect to structure and function as the fifth embodiment, and reference should be made to the above description thereof in this regard.

Figure 15:
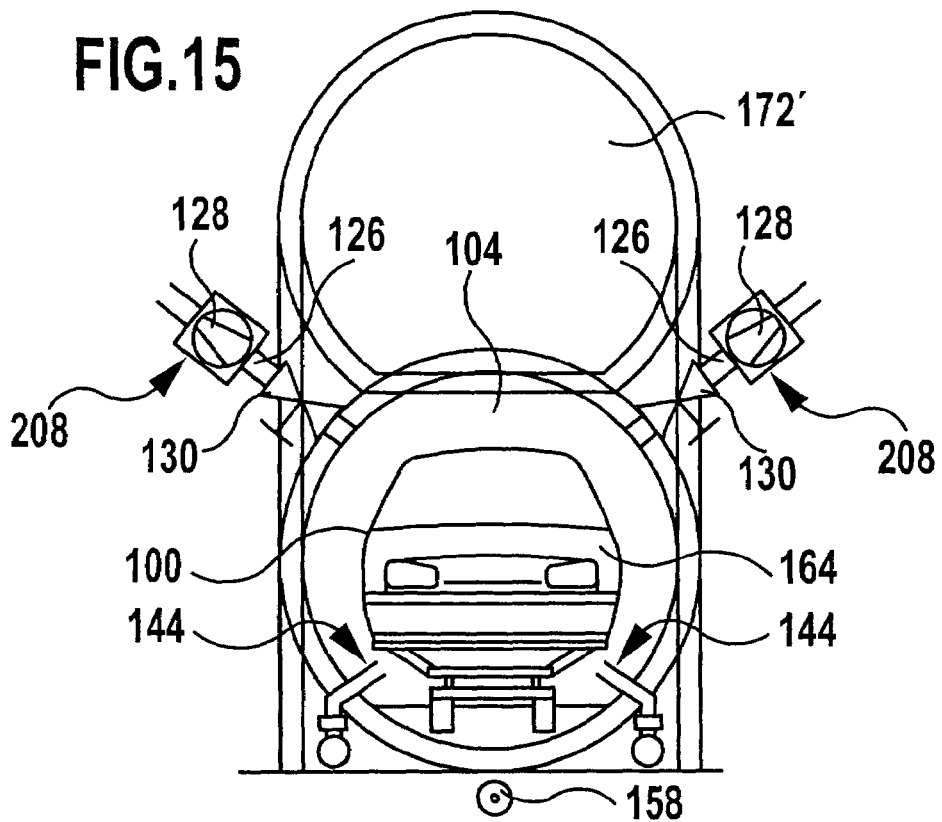
FIG. 15 is a schematic cross-sectional view through a seventh embodiment of a device for curing a radiation-curable coating which serves to cure a radiation-curable coating on vehicle bodies and comprises several feeder devices and suction devices for a process gas.

A seventh embodiment of a device for curing a radiation-curable coating 100 on a work piece 102 shown in FIG. 15 has several feeder devices 144 for supplying process gas to the plasma chamber 124 and several suction devices 208 for extracting gas from the plasma chamber 124.

Each of the suction devices 208 comprises a suction pipe 126, in which a non-return valve 130 and a vacuum pump 128 are disposed.

As may be seen from FIG. 15, the feeder devices 144 are disposed in the region below the horizontal longitudinal central plane of the vehicle bodies 164 and the suction devices 208 in the region above the horizontal longitudinal central plane of the vehicle bodies 164.

In this way, a defined flow of the process gas, in which the plasma is generated, from the bottom upwards through the plasma chamber 124 and in particular through the vehicle bodies 164 can be generated.

Generation of such a defined flow of the process gas through the plasma chamber 124 has proved favourable for generation of a stable plasma with a uniform radiation distribution.

Otherwise, the seventh embodiment of a device for curing a radiation-curable coating is the same with respect to structure and function as the third embodiment, and reference should be made to the above description thereof in this regard.

Figure 16:
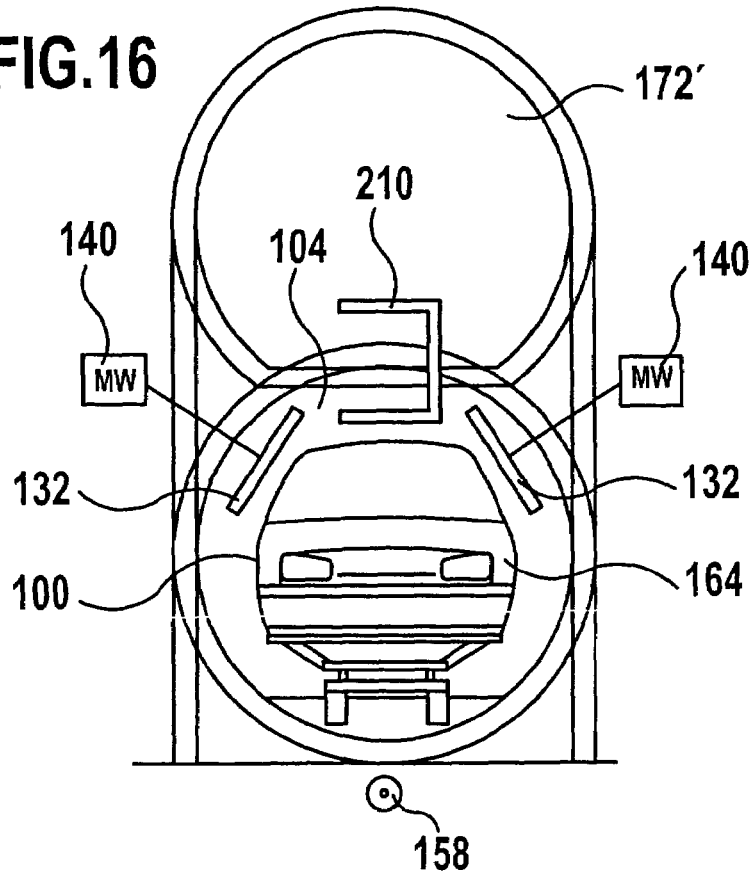
FIG. 16 is a schematic cross-sectional view through an eighth embodiment of a device for curing a radiation-curable coating which serves to cure a radiation-curable coating on vehicle bodies and is provided with a magnet for influencing the degree of ionisation of the generated plasma.

An eighth embodiment of a device for curing a radiation-curable coating shown in FIG. 16 differs from the above-described embodiments in that at least one magnet element 210 is additionally provided for generating a magnetic field in the plasma generation area 104.

The local degree of ionisation of the plasma and thus the radiation distribution in the plasma chamber 124 can be influenced by the magnetic field generated by the magnet element 210.

The magnet element 210 can be configured as a permanent magnet or as an electromagnet.

A configuration as electromagnet is particularly suitable for generating a time-variable magnetic field by means of the magnet element 210.

In particular, it can be provided that the magnetic field is only generated by the magnet element 210 after the start of the curing process of the coating 100, e.g. only after approximately half the curing time has elapsed, in order to reduce the intensity of the radiation, to which particularly exposed points of the work piece 102 are subjected.

In particular, it is possible in this way to prevent yellowing during curing of light, in particular white, paints.

Otherwise, the eighth embodiment of a device for curing a radiation-curable coating on a work piece is the same with respect to structure and function as the third embodiment, and reference should be made to the above description thereof in this regard.

Particularly in the case of work pieces 102 made of an electrically conductive material, it may be of advantage for stabilising the generated plasma if the work piece 102 provided with the coating 100 and the boundary walls of the plasma chamber 124 are connected to the same electric potential.

This can be achieved in particular by connecting the work piece 102 to the boundary walls of the plasma chamber 124 in an electrically conductive manner by means of an electrically conductive work piece holder.

By way of example, a vehicle body 164 is shown in FIG. 18 which is connected via an electrically conductive work piece holder 212 to a skid frame 166, which is itself connected in an electrically conductive manner to the boundary walls of the plasma chamber 124. This ensures that the work piece (the vehicle body 164) is connected to an electric potential $\phi_1$, which is the same as the electric potential $\phi_2$, at which the skid frame 166 and the boundary walls of the plasma chamber 124 lie.

In particular, it can be provided that the work piece 102 and the boundary walls of the plasma chamber 124 are at earth potential.

Alternatively, however, it can also be advantageous in certain cases to connect the work piece 102 to an electric potential, which is different from the electric potential of the boundary walls of the plasma chamber 124.

In this case, it is necessary to separate the work piece 102 from the boundary walls of the plasma chamber 124 by an electrical insulator.

By way of example for this, a vehicle body 164 is shown in FIG. 17, which is mechanically connected to a skid frame 166 via a work piece holder 212. However, in this case, the work piece holder 212 comprises an electrical insulator 214, which electrically separates a part of the work piece holder 212 on the work piece side from a part of the work piece holder 212 on the skid frame side.

In this case, the electric potential $\phi_1$ of the work piece (vehicle body 164) can differ from the electric potential $\phi_2$ of the skid frame 166 and the boundary walls of the plasma chamber 124.

The potential $\phi_1$ of the work piece 102 can be set at a defined level, e.g. to earth potential or a potential differing from earth potential.

Alternatively, it can also be provided that the work piece 102 is not connected to an externally predetermined potential, but is kept variable.

The electrical insulator 214 can be formed from any desired material with adequate electrical insulation effect, e.g. a suitable plastic material or a suitable ceramic material.

The electrical insulator 214 is preferably formed from a vacuum-resistant material.

The invention claimed is:

1. A process for curing a coating on a work piece, comprising:
   providing a coating on a work piece by one of dip-coating, spray painting, and spraying, said coating comprising a lacquer adapted to be cured by UV radiation, said lacquer containing at least one photo-initiator;
   after said providing of said coating on said work piece, placing the work piece with the coating in a plasma generation area; and
   generating a plasma in said plasma generation area, the UV radiation suitable for curing said coating being generated by stimulating gas particles within said plasma, said gas particles emitting said UV radiation;
   essentially completely curing said coating by means of said UV radiation emitted by said gas particles and triggering a cross-linking reaction in said coating;
   wherein:
   said work piece has a cavity and at least one undercut coated with said coating and/or at least one shaded region coated with said coating, said undercut and said shaded region, respectively, comprising a region into which no UV radiation can reach from the plasma generation area located outside the work piece; and
   said UV radiation emitted by said gas particles reaches said work piece from different sides thereof and also reaches said undercut and said shaded region, respectively.

2. A process according to claim 1, wherein the UV radiation generated in said plasma has at least one wavelength in the range of approximately 100 nm to approximately 400 nm.

3. A process according to claim 1, wherein the pressure in the plasma generation area is set to a maximum value of approximately 100 Pa.

4. A process according to claim 1, wherein the pressure in the plasma generation area is set to a maximum value of approximately 1 Pa.

5. A process according to claim 1, wherein the pressure in the plasma generation area is set to a maximum value of approximately 0.1 Pa.

6. A process according to claim 1, wherein the plasma generation area contains at least one of:
   (i) nitrogen,
   (ii) argon as an inert gas,
   (iii) another inert gas,
   as a process gas.

7. A process according to claim 1, wherein the plasma generation area contains a process gas to which at least one of:
   (i) a metal,
   (ii) a metal halide,
   (iii) another additive
   has been added.

8. A process according to claim 1, wherein the plasma is generated by inputting an electromagnetic radiation into the plasma generation area by means of at least one input device.

9. A process according to claim 8, wherein the plasma is generated by the input of microwave radiation having a frequency in the range of approximately 1 GHz to approximately 10 GHz.

10. A process according to claim 8, wherein the plasma is generated by the input of microwave radiation having a frequency in the range of approximately 2 GHz to approximately 3 GHz.

11. A process according to claim 1, wherein the plasma is generated by inputting electromagnetic radiation into the plasma generation area, said electromagnetic radiation being generated by means of a magnetron.

12. A process according to claim 1, wherein a magnetic field is generated in said plasma generation area to provide an electron cyclotron resonance (ECR) effect.

13. A process according to claim 1, wherein the plasma is generated by inputting an electromagnetic radiation into the plasma generation area by means of a plurality of input devices.

14. A process according to claim 8, wherein:
   the cavity has an access opening, said coating extending over said work piece and into said cavity, and
   said electromagnetic radiation input into the plasma generation area by means of at least one input device passes through the access opening into the cavity of the work piece such that said plasma is generated in said cavity and outside of said workpiece for curing the coating.

15. A process according to claim 1, wherein a gas to be ionized is fed to the plasma generation area during the curing process.

16. A process according to claim 15, wherein the gas to be ionized is fed to the plasma generation area by means of a feeder device, which is adjacent to an input device, by means of which an electromagnetic radiation is input into the plasma generation area.

17. A process according to claim 1, wherein the work piece is placed into an antechamber and is transferred from the antechamber into the plasma generation area for the curing process.

18. A process according to claim 17, wherein the antechamber is evacuated after the work piece has been placed therein.

19. A process according to claim 17, wherein the work piece is subjected to microwave radiation in the antechamber in order to provide one of preliminary drying of the coating and ignition of the plasma in the antechamber.

20. A process according to claim 1, wherein the work piece is transferred from the plasma generation area into an exit chamber after the curing process.

21. A process according to claim 20, wherein before the work piece is transferred into the exit chamber, the exit chamber is evacuated.

22. A process according to claim 1, wherein the work piece is non-planar in construction.

23. A process according to claim 1, wherein the work piece comprises an electrically conductive material.

24. A process according to claim 1, wherein the work piece comprises a metallic material.

25. A process according to claim 1, wherein the work piece comprises at least one of a plastic material and wood.

26. A process according to claim 1, wherein the plasma generation area contains at least one of nitrogen, helium and argon as a process gas.

27. A process according to claim 1, wherein the plasma generation area contains a process gas, the composition of which varies during the curing process.

28. A process according to claim 27, wherein the composition of the process gas varies such that during a first phase of the curing process the UV radiation generated in the plasma during the curing process has a first average wavelength, and during a later, second phase of the curing process has a second average wavelength, the second average wavelength being different from the first average wavelength.

29. A process according to claim 28, wherein the second wavelength is less than the first wavelength.

30. A process according to claim 27, wherein the composition of the process gas is varied such that the UV radiation generated in the plasma during the curing process shifts towards lower average wavelengths as the curing duration increases.

31. A process according to claim 1, wherein the plasma is ignited, and at the time at which the plasma is ignited, the plasma generation area contains argon.

32. A process according to claim 31, wherein the plasma generation area contains essentially argon only, at the time at which the plasma is ignited.

33. A process according to claim 1, wherein at least one of a single gas and a mixture of different gases is fed to the plasma generation area via at least one feeder device.

34. A process according to claim 1, wherein the plasma is generated by the input of electromagnetic radiation into the plasma generation area by means of a plurality of input devices, wherein at least two of the input devices have different input powers from one another.

35. A process according to claim 1, wherein the plasma is generated by the input of electromagnetic radiation into the plasma generation area by means of a plurality of input devices, wherein at least two of the input devices differ in design.

36. A process according to claim 1, wherein at least one reflector is provided in the plasma generation area to reflect the UV radiation generated in the plasma.

37. A process according to claim 36, wherein at least one mirror film is provided as a reflector in the plasma generation area.

38. A process according to claim 36, wherein at least a sub-region of boundary walls of the plasma generation area is configured as a reflector.

39. A process according to claim 36, wherein the at least one reflector comprises at least one of aluminium and stainless steel as a reflective material.

40. A process according to claim 36, wherein the at least one reflector is removable from the plasma generation area.

41. A process according to claim 1, wherein gas is drawn off from the plasma generation area via one or more suction devices.

42. A process according to claim 1, wherein pressure in the plasma generation area is varied by means of at least one suction device with a throttle valve.

43. A process according to claim 1, wherein the work piece is electrically separated from boundary walls of the plasma generation area by means of an at least partially electrically insulating holder.

44. A process according to claim 1, wherein the work piece is connected to a different electric potential from an electric potential of boundary walls of the plasma generation area.

45. A process according to claim 1, wherein the work piece is connected in an electrically conductive manner to boundary walls of the plasma generation area by means of an electrically conductive holder.

46. A process according to claim 1, wherein the work piece is connected to the same electric potential as boundary walls of the plasma generation area.

47. A process according to claim 1, wherein the work piece is connected to ground.

48. A process according to claim 1, wherein the work piece is provided with a coating that is curable by a combination of:
   (i) said UV radiation, and
   (ii) heat.

49. A process according to claim 1, wherein:
   the work piece is subjected to additional radiation before, during and/or after generation of the plasma, and
   said additional radiation is not generated in the plasma.

50. A process according to claim 49, wherein the work piece is subjected to at least one of microwave radiation and infrared radiation, which is not generated in the plasma, before, during and/or after generation of the plasma.

51. A process according to claim 1, wherein the work piece is dried before, after and/or during generation of the plasma.

52. A process according to claim 1, wherein before generation of the plasma, the work piece is subjected to a pressure below atmospheric pressure.

53. A process according to claim 52, wherein said pressure is in the range of approximately 2000 Pa to approximately 50,000 Pa.

54. A process according to claim 1, wherein before generation of the plasma, the work piece is subjected to a pressure below atmospheric pressure, which is higher than the pressure to which the work piece is subjected during generation of the plasma.

55. A process according to claim 1, wherein a magnetic field is generated in the plasma generation area.

56. A process according to claim 55, wherein the intensity of the magnetic field is varied during a curing process.

57. A process according to claim 55, wherein the magnetic field is generated in the plasma generation area only after the start of a curing process.

58. A process according to claim 55, wherein the intensity of the magnetic field varies spatially in the plasma generation area.

59. A process according to claim 1, wherein said work piece is a vehicle body.

60. A process according to claim 1, wherein:
   the plasma generation area is arranged in a plasma chamber having at least one gate;
   the work piece is transported into the plasma chamber through the gate by means of a conveyor after said gate is opened; and
   the plasma is generated after said gate is closed.

61. A process according to claim 1, wherein said lacquer is a dual-cure lacquer which is adapted to be cured by the UV radiation and heat.

* * * * *